(12) United States Patent
Okayama et al.

(10) Patent No.: US 8,189,369 B2
(45) Date of Patent: *May 29, 2012

(54) SEMICONDUCTOR DEVICE

(75) Inventors: Shota Okayama, Tokyo (JP);
Yasumitsu Murai, Itami (JP)

(73) Assignee: Renesas Electronics Corporation, Kawasaki-shi (JP)

(*) Notice: Subject to any disclaimer, the term of this patent is extended or adjusted under 35 U.S.C. 154(b) by 0 days.

This patent is subject to a terminal disclaimer.

(21) Appl. No.: 12/971,324

(22) Filed: Dec. 17, 2010

(65) Prior Publication Data

US 2011/0085374 A1    Apr. 14, 2011

Related U.S. Application Data

(63) Continuation of application No. 12/340,513, filed on Dec. 19, 2008, now Pat. No. 7,872,907.

(30) Foreign Application Priority Data

Dec. 28, 2007  (JP) .................................. 2007-339854
May 29, 2008   (JP) .................................. 2008-140921

(51) Int. Cl.
*G11C 11/00* (2006.01)
(52) U.S. Cl. ...................................... 365/158; 365/171
(58) Field of Classification Search .................. 365/158, 365/171, 173
See application file for complete search history.

(56) References Cited

U.S. PATENT DOCUMENTS

| 6,683,807 | B2 | 1/2004 | Hidaka |
| 6,999,341 | B2 | 2/2006 | Ooishi |
| 7,016,222 | B2 | 3/2006 | Morikawa |
| 7,035,137 | B2* | 4/2006 | Iwata et al. .................... 365/158 |
| 7,489,001 | B2 | 2/2009 | Hidaka |
| 2005/0036361 | A1 | 2/2005 | Fukuzumi |
| 2005/0195662 | A1* | 9/2005 | Ooishi ..................... 365/189.05 |

FOREIGN PATENT DOCUMENTS

JP   2003-077267 A   3/2003
JP   2007-109313 A   4/2007

* cited by examiner

*Primary Examiner* — Anh Phung
(74) *Attorney, Agent, or Firm* — Miles & Stockbridge P.C.

(57) ABSTRACT

There is provided a semiconductor device that enables high-speed data read and reduces the area of a drive circuit for activating a word line. By signal transmission through a common word line having a low resistance and coupled at a plurality of points to a word line, it is possible to read data at high speed. Further, since the common word line is provided common to a plurality of memory blocks, a word line driver can be provided common to the memory blocks. Further, by disposing a latch circuit, corresponding to a sub-digit line, for holding the active state of the common word line, it is possible to transmit a row selection signal during data write through the common word line and thereby reduce a metal wiring layer.

3 Claims, 23 Drawing Sheets

SEMICONDUCTOR DEVICE

CROSS-REFERENCE TO RELATED APPLICATIONS

This application is a continuation of application Ser. No. 12/340,513 filed Dec. 19, 2008, now U.S. Pat. No. 7,872,907, issued Jan. 18, 2011. Also, the disclosure of Japanese Patent Application No. 2008-140921 filed on May 29, 2008 and the disclosure of Japanese Patent Application No. 2007-339854 filed on Dec. 28, 2007 including the specification, drawings and abstract are incorporated herein by reference in their entirety.

BACKGROUND OF THE INVENTION

The present invention relates to a semiconductor device in which thin-film magnetic memory elements utilizing a magnetoresistance effect that an electrical resistance varies according to a magnetization direction are integrated over a substrate.

Attention is being given to an MRAM (Magnetic Random Access Memory) as a nonvolatile RAM (Random Access Memory) capable of performing a high-speed operation with low power consumption. The MRAM is a kind of thin-film magnetic memory device utilizing a magnetoresistance effect that an electrical resistance varies according to a magnetization direction. In the MRAM, a TMR (Tunneling Magneto-Resistive) element is generally used as a magneto-resistive element.

The TMR element is a magneto-resistive element having a tunnel junction structure in which a thin insulating layer is sandwiched between a pinned magnetic layer made of a ferromagnetic thin film and a free magnetic layer. The TMR element stores information of "1" or "0" depending on whether the magnetization directions of two layers are parallel or anti-parallel.

During data read, a sense current (data read current) is fed through the TMR element to detect a tunnel resistance difference resulting from a magnetization direction. The TMR element is coupled in series with an access transistor for on/off control of the sense current. The gate electrode of the access transistor is coupled to a word line.

There are known a method of reversing the magnetization by a current-induced magnetic field and a spin-polarized current injection method as a method for reversing the magnetization direction of a free magnetic layer during data write.

The current-induced magnetic field method utilizes a synthetic magnetic field induced by simultaneously supplying currents through a bit line and a digit line intersecting with each other. In the TMR element disposed adjacent to the intersection of the bit line and the digit line, the magnitude of the induced synthetic magnetic field is outside the asteroid curve, which reverses the magnetization.

On the other hand, the spin injection method reverses the magnetization direction of the free magnetic layer by directly supplying a bit line current exceeding a threshold through the TMR element.

In the case of supplying a current from the free magnetic layer toward the pinned magnetic layer, electrons with spin of the same direction as that of the pinned magnetic layer pass through a tunnel insulating film and are injected into the free magnetic layer. At this time, the injected electrons produce a spin torque in the free magnetic layer, so that the magnetization direction of the free magnetic layer changes to the same direction as that of the pinned magnetic layer.

On the other hand, in the case of supplying a current from the pinned magnetic layer toward the free magnetic layer, electrons with spin of the opposite direction to that of the pinned magnetic layer are reflected by the tunnel insulating film. At this time, the reflected electrons produce a spin torque in the free magnetic layer, so that the magnetization direction of the free magnetic layer changes to the opposite direction to that of the pinned magnetic layer.

There is known a combined method of the current-induced magnetic field method and the spin injection method as another method for writing data.

For example, in Japanese Unexamined Patent Publication No. 2007-109313, a digit line drive circuit supplies a write current through a selected digit line during data write. Further, the magnetization direction of the free magnetic layer of a memory cell coupled to the digit line is set to the opposite direction to that of the pinned magnetic layer by the current-induced magnetic field. Then, with a bit line current from a write drive circuit, spin-polarized electrons of the same direction as that of the spin polarization of the pinned magnetic layer are injected into the free magnetic layer to write only data "1". The spin injection is performed in parallel with the memory cell to which data "1" is written.

In a memory array where a plurality of TMR memory cells are arranged in matrix form, a digit line and a word line are disposed corresponding to a memory cell row, and a bit line is disposed corresponding to a memory cell column. The digit line and the word line are often divided into a plurality of digit lines and word lines.

For example, Japanese Unexamined Patent Publication No. 2003-77267 discloses a technique of segmenting an entire memory array into memory cell blocks arranged in the form of a matrix with m rows and n columns (m, n: natural numbers). In each memory cell block, TMR memory cells are arranged in matrix form. A sub-word line for data read and a write digit line for data write are disposed in each memory cell row. That is, a write digit line is disposed corresponding to each memory cell row in each memory cell block independently. Further, there is hierarchically provided a main word line as an upper signal line for row selection, along with sub-word lines and write digit lines. The main word line is disposed every multiple memory cell rows and disposed common to n memory cell blocks adjacent in a row direction.

SUMMARY OF THE INVENTION

In the conventional technique disclosed in Japanese Unexamined Patent Publication No. 2003-77267, drive circuits for the sub-word line and the write digit line are required to be provided individually for each memory cell, separately from a row decode circuit. Accordingly, the drive circuit area of the entire memory array increases as the number of memory cell blocks increases by segmenting the memory array.

On the other hand, from the viewpoint of the enhancement of data read speed, it is preferable that the number of memory cell blocks is increased to make the length of the sub-word line smaller. This is because the sub-word line for controlling the gate voltage of the access transistor is formed of polysilicon, polycide, or the like in the same wiring layer as the gate. As a result of using these materials, the resistance of the sub-word line is higher than that of metal wiring, which causes signal transmission delay during data read. That is, with the above conventional techniques, it is difficult to ensure compatibility between the enhancement of data read speed and the reduction of the circuit area.

It is originally one of the features that the magnetoresistance-effect-based MRAM enables high-speed data read/ write. Accordingly, it is desirable that the MRAM enables higher-speed data read/write also in order to be differentiated from the flash memory.

Accordingly, it is an object of the present invention to provide a semiconductor device that enables high-speed data read and enables a reduction in the area of a word line drive circuit.

A semiconductor device according to the invention includes a memory array which includes a plurality of memory cells arranged in matrix form and is divided into a plurality of blocks in a row direction. Each of the memory cells includes a magneto-resistive element whose electrical resistance varies according to magnetic data and a switch element coupled in series with the magneto-resistive element and having a control electrode. A thin-film magnetic memory device according to the invention further includes a plurality of bit lines, a plurality of digit lines, a plurality of word lines, and a plurality of common word lines. The bit lines are provided corresponding to memory cell columns of the memory array respectively and each used for supplying a first data write current necessary to write the magnetic data. The digit lines are each provided in each memory cell row in each of the blocks individually and used for writing the magnetic data by supplying a second data write current in a direction intersecting the first data write current. The word lines are each coupled to a plurality of control electrodes included in a corresponding memory cell row of the memory array and formed with a conductive layer having a first sheet resistance. The common word lines are provided corresponding to memory cell rows of the memory array respectively and provided common to the blocks, each of the common word lines being formed with a conductive layer having a second sheet resistance lower than the first sheet resistance and electrically coupled at a plurality of points to a word line provided in a corresponding memory cell row.

According to the invention, the common word line is coupled at a plurality of points to the word line and formed with the conductive layer having the sheet resistance lower than that of the conductive layer where the word line is formed; accordingly, by signal transmission through the common word line, it is possible to read data at high speed. Further, since the common word line is provided common to a plurality of blocks, a word line drive circuit for activating the word line can be provided common to the blocks. Accordingly, the number of word line drive circuits can be reduced compared to the case where the word line is provided for each block independently to enhance data read speed.

On the other hand, since the digit line is provided for each block independently, it is possible to reduce the wiring resistance. As a result, it is possible to supply a current large enough to write data.

DETAILED DESCRIPTION OF THE PREFERRED EMBODIMENTS

Figure 1:
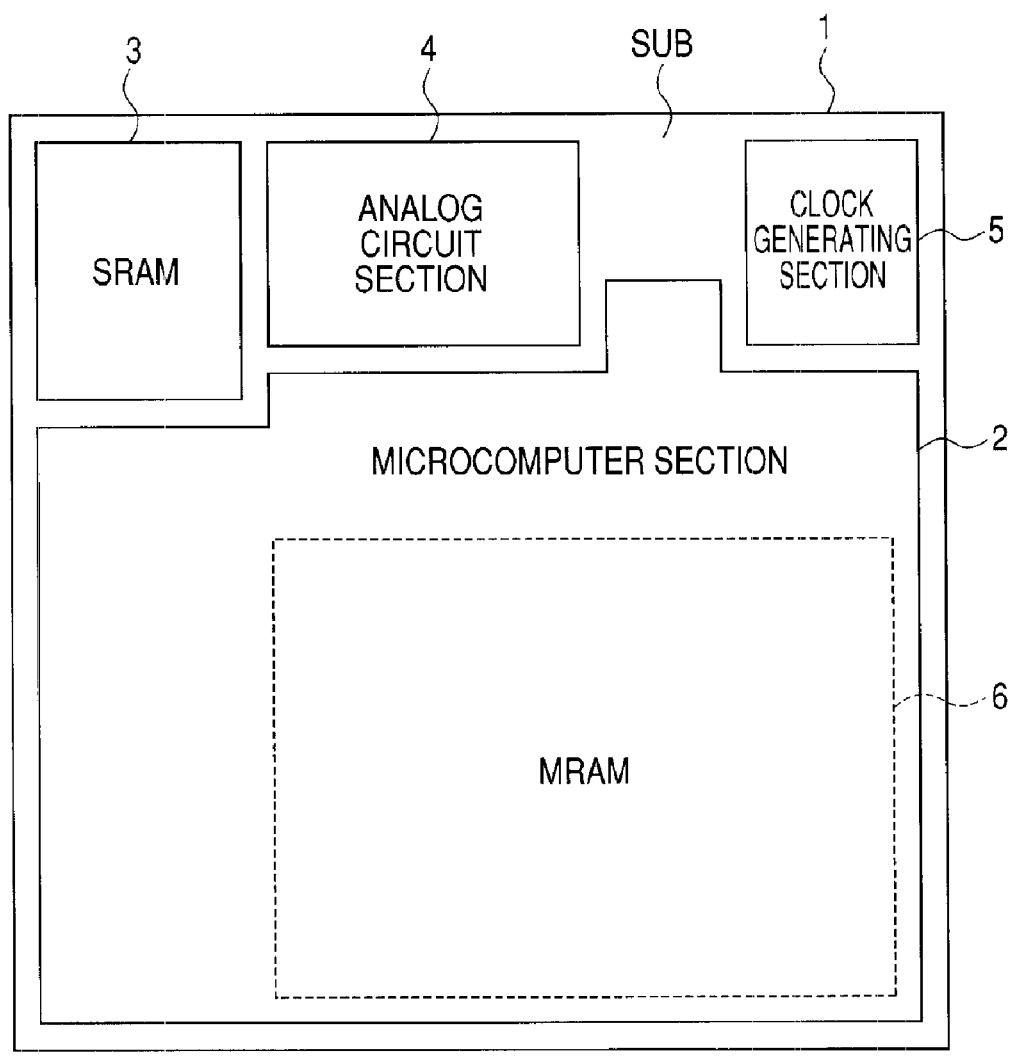
FIG. 1 is a plan view schematically showing an example of the configuration of a semiconductor device 1 according to a first embodiment of the present invention.

Hereinafter, preferred embodiments of the present invention will be described in detail with reference to the accompanying drawings. The same or equivalent sections are denoted by the same reference numerals, and their description will not be repeated.

In the following embodiments, description will be made as to an MRAM of a method for reversing the magnetization of a free magnetic layer by a current-induced magnetic field; however, the invention is applicable to an MRAM of a method for writing data by combining a current-induced magnetic field with spin injection.

First Embodiment

FIG. 1 is a plan view schematically showing an example of the configuration of a semiconductor device 1 according to the first embodiment of the invention.

The semiconductor device 1 includes a microcomputer section 2, an SRAM (Static Random Access Memory) section 3, an analog circuit section 4, and a clock generating section 5 which are formed over a semiconductor substrate SUB. The semiconductor device 1 is an example of a semiconductor integrated circuit called a system LSI (Large Scale Integrated circuit) where memory circuits, analog circuits, and digital circuits are integrated over one semiconductor substrate.

The microcomputer section 2 includes an MRAM section 6 as a memory circuit. Conventionally, a microcomputer contains various kinds of memories including a flash memory and a DRAM (Dynamic Random Access Memory) as memories such as a ROM (Read Only Memory) and a RAM. In the semiconductor device 1, these various kinds of memory devices are replaced with an MRAM characterized by high speed, low power consumption, nonvolatility, and an unlimited number of writes. In FIG. 1, the SRAM section 3 is provided independently of the MRAM section 6; however, the SRAM section 3 can be replaced by an MRAM.

Figure 2:
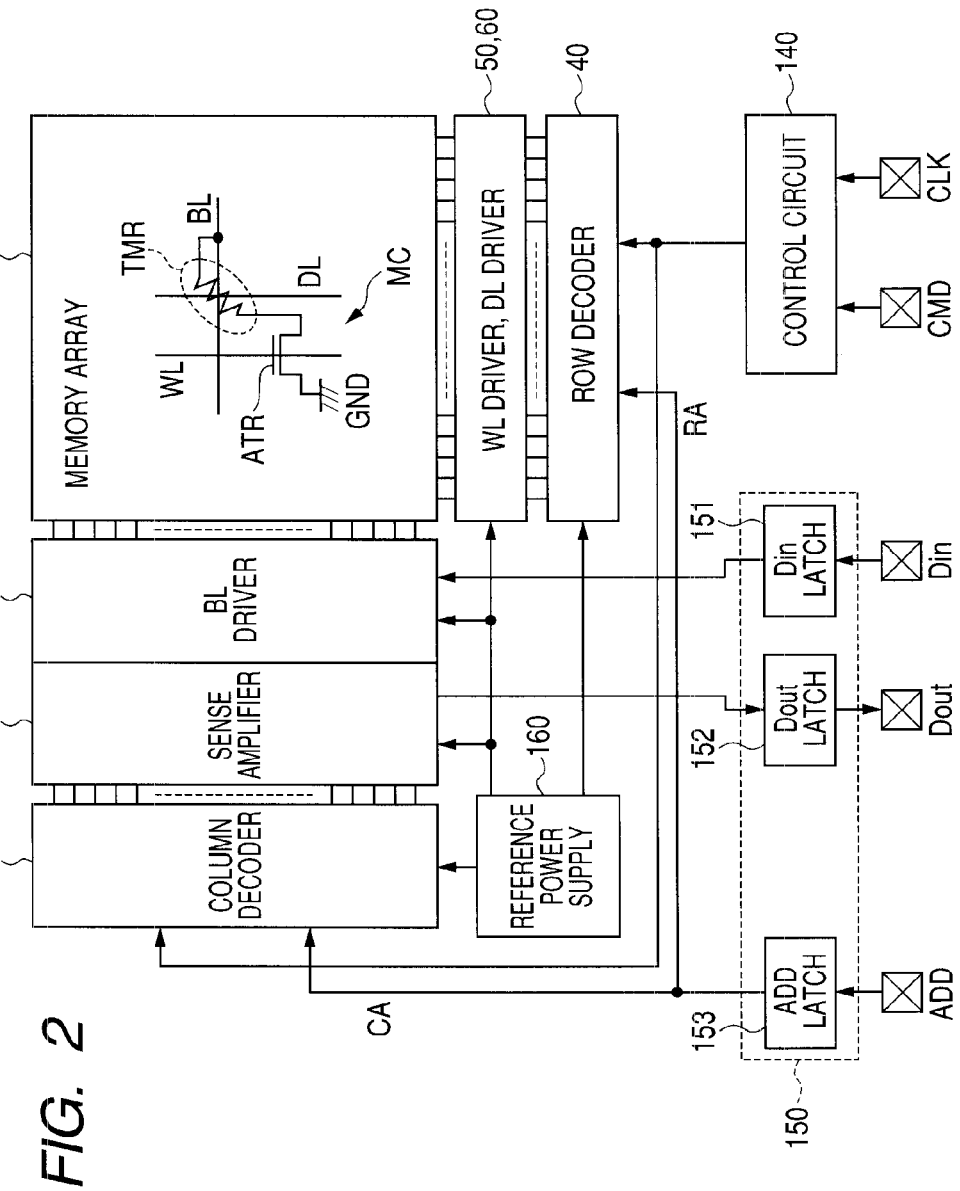
FIG. 2 is a block diagram showing the overall configuration of an MRAM section 6 shown in FIG. 1.

FIG. 2 is a block diagram showing the overall configuration of the MRAM section 6 shown in FIG. 1. In FIG. 2, the MRAM section 6 writes write data Din and reads read data Dout by performing random access to a memory array 10 in response to an instruction signal CMD, a clock signal CLK, and an address signal ADD.

The MRAM section 6 includes a control circuit 140 for controlling the overall operation of the MRAM section 6 in response to the instruction signal CMD and the clock signal CLK, the memory array 10 having a plurality of memory cells MC arranged in matrix form, and an input/output circuit 150 for inputting/outputting the address signal ADD, the write data Din, and the read data Dout.

Each memory cell MC includes a TMR element and an access transistor ATR. To read and write data from and to a plurality of memory cells MC, a plurality of word lines WL, digit lines DL, and bit lines BL are disposed in the memory array 10. The word lines WL and the digit lines DL are disposed corresponding to memory cell rows respectively in a row direction, and the bit lines BL are disposed corresponding to memory cell columns respectively in a column direction.

The input/output circuit 150 includes an address signal latch circuit 153, a write data latch circuit 151, and a read data latch circuit 152 which temporarily hold the address signal ADD, the write data Din, and the read data Dout, respectively.

The MRAM section 6 further includes a sense amplifier 20, a row decoder (row decode circuit, row selection circuit) 40, a word line driver (word line drive circuit) 50, a digit line driver (digit line drive circuit) 60, a column decoder (column decode circuit, column selection circuit) 70, and a bit line driver (bit line drive circuit) 80.

The sense amplifier 20 detects and amplifies the difference between a passing current of a memory cell selected at the time of data read and a reference current. The sense amplifier 20 outputs the detected and amplified signal to the read data latch circuit 152.

The row decoder 40 receives the address signal ADD from the address signal latch circuit 153 and decodes a row address signal RA indicated by the address signal ADD. The row decoder 40 outputs a row selection signal which is a decode result, in response to the instruction signal CMD (read enable signal RE, write enable signal WE) and the clock signal CLK from the control circuit 140. The row selection signal is used for row selection in the memory array 10.

The word line driver 50 receives the row selection signal from the row decoder 40 during data read and activates a corresponding word line.

The digit line driver 60 receives the row selection signal from the row decoder 40 during data write and supplies a current through a corresponding digit line DL in a direction according to the write data Din from the write data latch circuit 151.

The column decoder 70 receives the address signal ADD supplied from the address signal latch circuit 153 and decodes a column address signal CA indicated by the address signal ADD. The column decoder 70 outputs a column selection signal which is a decode result, in response to the instruction signal CMD (read enable signal RE, write enable signal WE) and the clock signal CLK supplied from the control circuit 140. The column selection signal is used for column selection in the memory array 10.

The bit line driver 80 receives the column selection signal from the column decoder 70 and supplies a data write current through a corresponding bit line BL during data write.

The MRAM section 6 further includes a reference power supply 160 for generating various reference voltages supplied to the sense amplifier 20, the row decoder 40, the word line driver 50, the digit line driver 60, the column decoder 70, the bit line driver 80, and the like.

Figure 3:
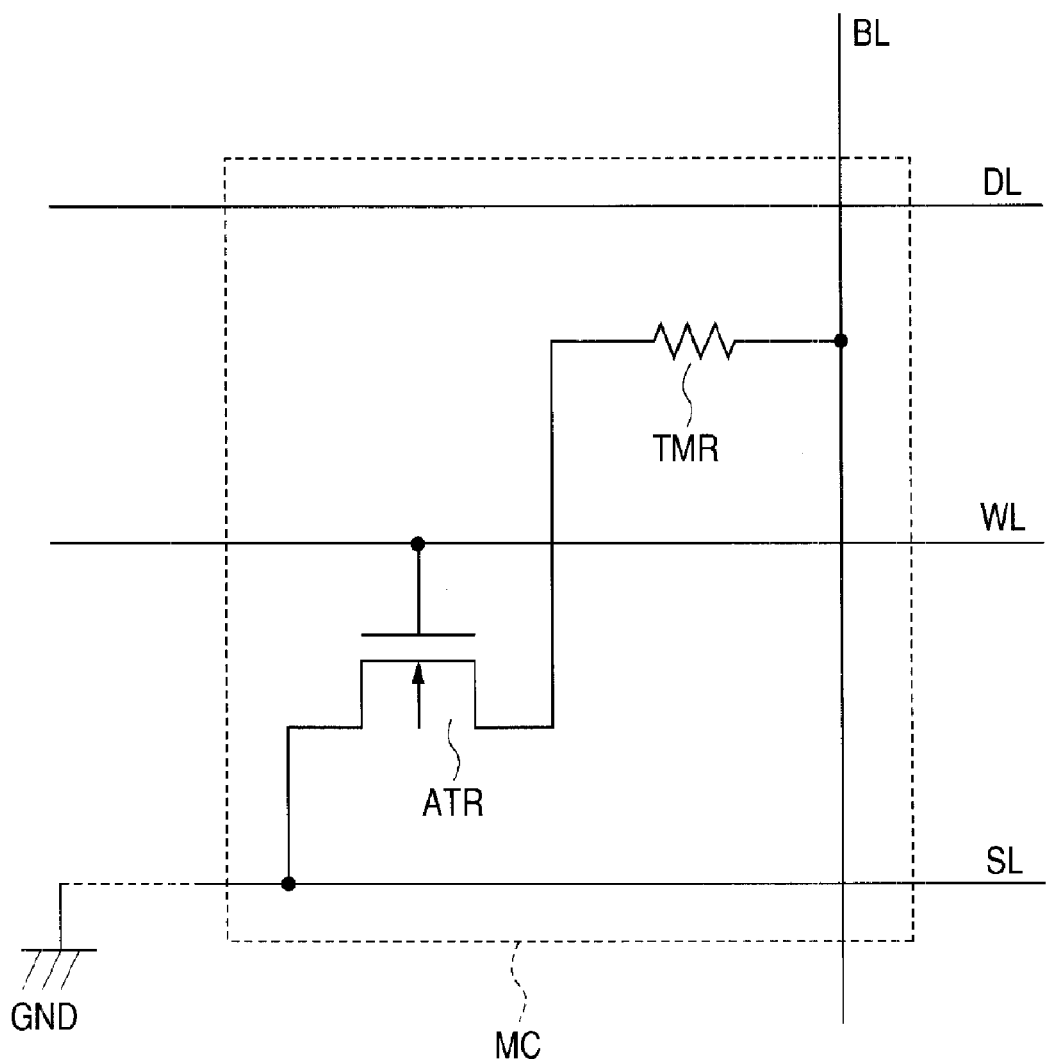
FIG. 3 is a circuit diagram schematically showing the configuration of each memory cell MC forming a memory array 10 shown in FIG. 2.

FIG. 3 is a circuit diagram schematically showing the configuration of each memory cell MC forming the memory array 10 shown in FIG. 2.

In FIG. 3, the memory cell MC includes a TMR element whose electrical resistance varies according to magnetic data and an access transistor ATR. The TMR element is a magneto-resistive element having a tunnel junction structure in which a thin insulating layer is sandwiched between a pinned magnetic layer made of a ferromagnetic thin film and a free magnetic layer. Usually, a field-effect transistor is used as the access transistor ATR.

A bit line BL, a digit line DL, a word line WL, and a source line SL are disposed for the TMR element. As shown in FIG. 3, the TMR element is coupled at one end to the bit line BL and coupled at the other end to the drain of the access transistor ATR. The source of the access transistor ATR is coupled to a ground node GND through the source line SL. The gate of the access transistor ATR is coupled to the word line WL.

During data write, respective data write currents are fed through the digit line DL of a memory cell row (hereinafter also referred to as a selected row) corresponding to a selected memory cell subject to data write and the bit line BL of a memory cell column (hereinafter also referred to as a selected column) corresponding to the selected memory cell. The direction of a current flowing through the bit line BL can be switched according to write data. The magnetization direction of a free magnetic layer is determined by the direction of a current flowing through the bit line BL.

On the other hand, during data read, the word line WL corresponding to a selected memory cell is activated to a high voltage state, and the access transistor ATR is brought into conduction. As a result, a sense current (data read current) flows from the bit line BL through the TMR element and the access transistor ATR to the source line SL. Hereinafter, the binary states of a high voltage and a low voltage for signals, signal lines, data, and the like are referred to as an "H level" and an "L level", respectively.

The source line SL, the bit line BL, and the digit line DL are formed with a metal wiring layer. On the other hand, the word line WL is integrated with the gate of the access transistor ATR to enhance the integration density and simplify the manufacturing process. Accordingly, the word line WL is formed of polysilicon, polycide, or the like.

Figure 4:
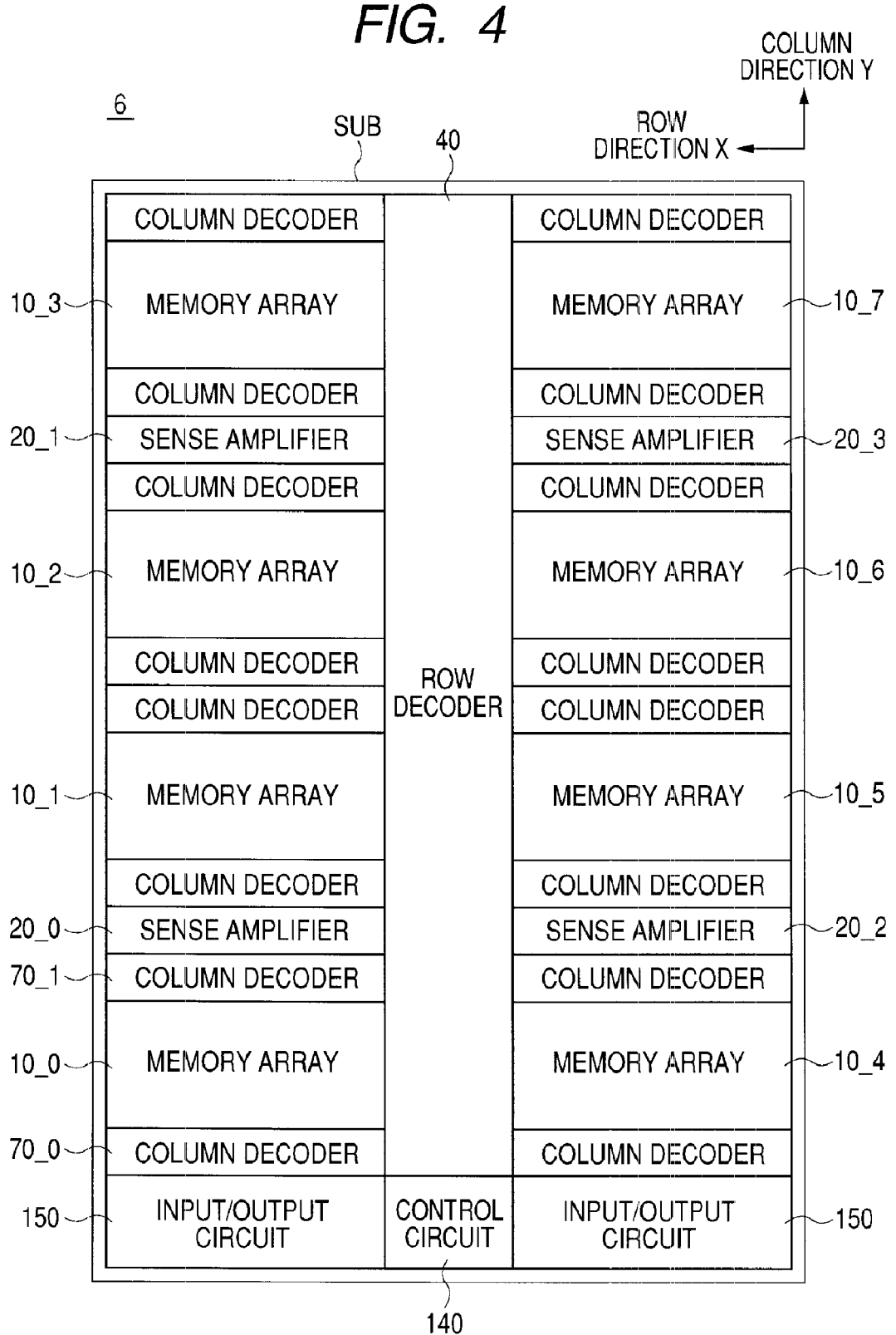
FIG. 4 is a plan view showing an example of the arrangement of each section in the MRAM section 6 shown in FIG. 2.

FIG. 4 is a plan view showing an example of the arrangement of each section in the MRAM section 6 shown in FIG. 2. Hereinafter, in FIG. 4, the horizontal direction is referred to as a row direction X or an X direction, and the vertical direction is referred to as a column direction Y or a Y direction.

In FIG. 4, the memory array 10 is divided into a plurality of memory arrays having the same configuration and disposed over a substrate SUB. In FIG. 4, eight memory arrays 10_0 to 10_7 are disposed in four rows by two columns in the row direction X and the column direction Y. Each memory array 10_0 to 10_7 includes a plurality of memory cells MC arranged in matrix form in the X and Y directions. As will be described later, each memory array 10_0 to 10_7 is divided into a plurality of memory blocks BK in the row direction X.

Column decoders 70 are disposed on both sides of each memory array 10_0 to 10_7 in the column direction Y. For example, column decoders 70_0 and 70_1 are disposed on both sides of the memory array 10_0 in the column direction Y. On the other hand, a row decoder 40 is disposed substantially at the center in the row direction X and extended in the column direction Y.

A sense amplifier 20 is disposed in the center between a pair of memory arrays adjacent to each other in the column direction Y. For example, in FIG. 4, a sense amplifier 20_0 is disposed in the center between the memory arrays 10_0 and 10_1. The other sense amplifiers 20_1 to 20_3 are disposed in the same manner.

The MRAM section 6 shown in FIG. 4 has an open bit line structure in which the bit lines BL coupled to the sense amplifiers 20_0 to 20_3 are disposed on both sides of the sense amplifiers 20_0 to 20_3. The invention is also applicable to a folded bit line structure in which the bit lines BL are folded at the sense amplifiers 20 and disposed in the same direction.

A control circuit 140 and input/output circuits 150 are disposed one end of the MRAM section 6 in the column direction Y.

Figure 5:
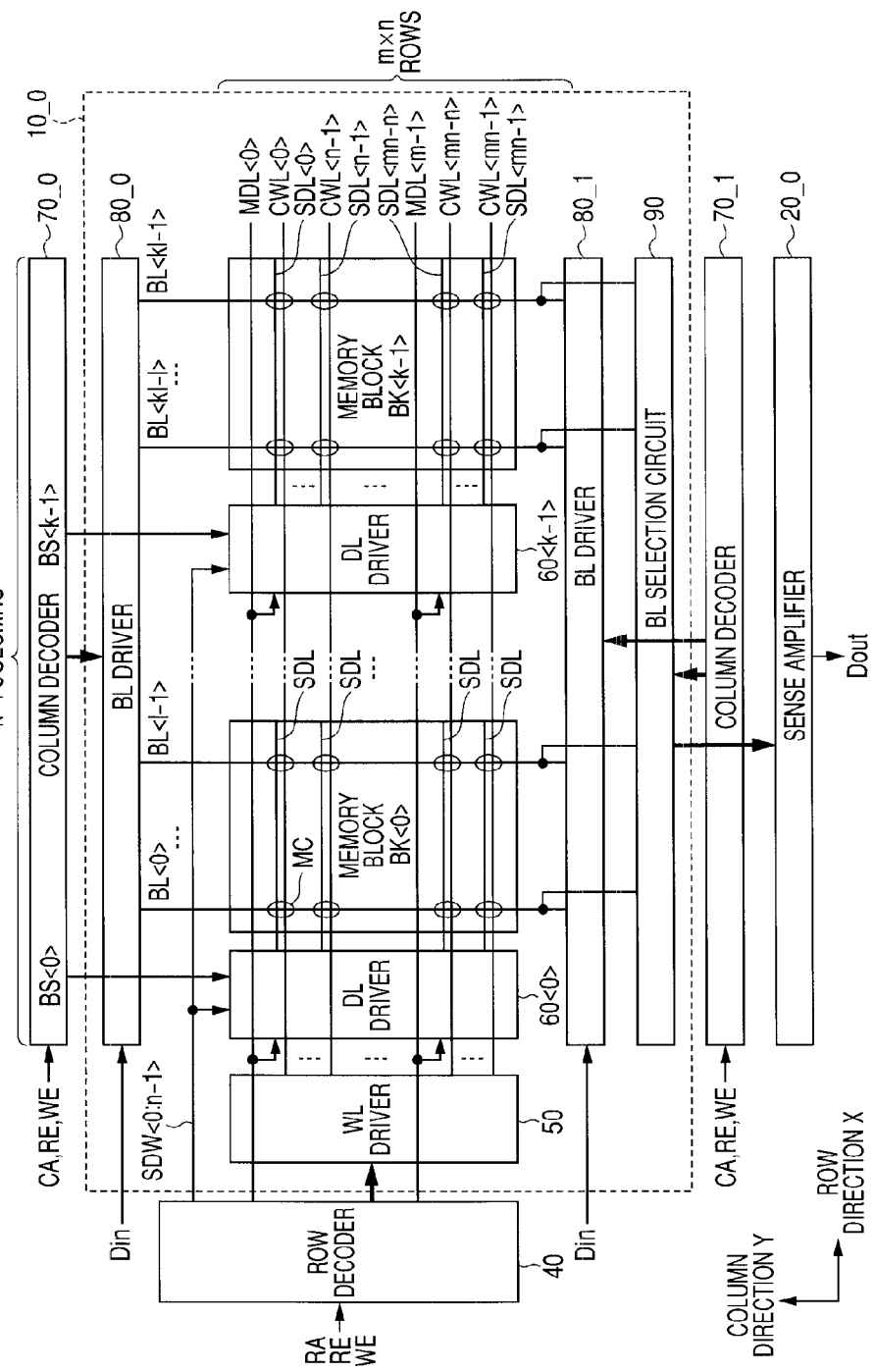
FIG. 5 is a diagram of assistance in explaining the configuration of a memory array 10_0 shown in FIG. 4.

FIG. 5 is a diagram of assistance in explaining the configuration of the memory array 10_0 shown in FIG. 4. FIG. 5 shows the configuration of the memory array 10_0 typifying the memory arrays 10_0 to 10_7 in the MRAM section 6 shown in FIG. 4.

In FIG. 5, the memory array 10_0 includes k (k is an integer not less than 2) memory blocks BK<0> to BK<k−1> (also generically called the memory block BK) disposed in the row direction X.

Each memory block BK includes a plurality of memory cells MC arranged in matrix form in the X and Y directions. As shown in FIG. 5, in each memory block BK, m×n rows (m and n are integers not less than 2) by l columns (l is an integer not less than 2) of memory cells MC are disposed in the X and Y directions. Accordingly, in the entire memory array 10_0, m×n rows by k×l columns of memory cells MC are disposed in the X and Y directions. As will be described later, the parameter m denotes the number of main digit lines MDL.

For example, in the case where m=64, n=4, k=4, l=128, each memory block BK includes 256 words×128 bits and has a memory capacity of 32 Kbits. Accordingly, the memory array 10_0 has a memory capacity of 128 Kbits, and the entire MRAM section 6 shown in FIG. 4 has a memory capacity of 1 Mbits.

The memory array 10_0 further includes a plurality of bit lines BL, sub-digit lines SDL, main digit lines MDL, word lines WL, and common word lines CWL.

In the column direction Y, k×l bit lines BL<0> to BL<kl−1> (also generically called the bit line BL) are provided corresponding to the memory cell columns respectively.

In the row direction X, m×n sub-digit lines SDL<0> to SDL<mn−1> (also generically called the sub-digit line SDL) are provided corresponding to the memory cell rows respectively in each memory block BK. Further, m main digit lines MDL<0> to MDL<m−1> (also generically called the main digit line MDL) are provided common to the k memory blocks BK in the memory array 10_0 along the row direction X.

In the first embodiment, the digit lines DL are divided into the main digit lines MDL and the sub-digit lines SDL in a hierarchical fashion. In this case, it can be considered that m×n sub-digit lines SDL belonging to each memory block BK are divided into row groups of n adjacent sub-digit lines SDL. All the sub-digit lines SDL configure m row groups. The main digit lines MDL correspond to the m row groups respectively. For example, the main digit line MDL<0> corresponds to a row group configured by the sub-digit lines SDL<0> to SDL<n−1>. Similarly, the main digit line MDL<m−1> corresponds to a row group configured by the sub-digit lines SDL<mn−n> to SDL<mn−1>.

Main decode signals transmitted by the main digit lines MDL and n-bit sub-decode signals SDW<0> to SDW<n−1> (also called a sub-decode signal SDW<0:n−1> and also generically called the sub-decode signal SDW) are used as row selection signals outputted from the row decoder 40 during data write. The output nodes of the row decoder 40 are coupled to the m main digit lines MDL and n signal lines for the sub-decode signals SDW. During data write, one of the row groups is selected by a main decode signal on the main digit line MDL. Further, one sub-digit line SDL belonging to the selected row group is selected by a sub-decode signal SDW.

Figure 6:
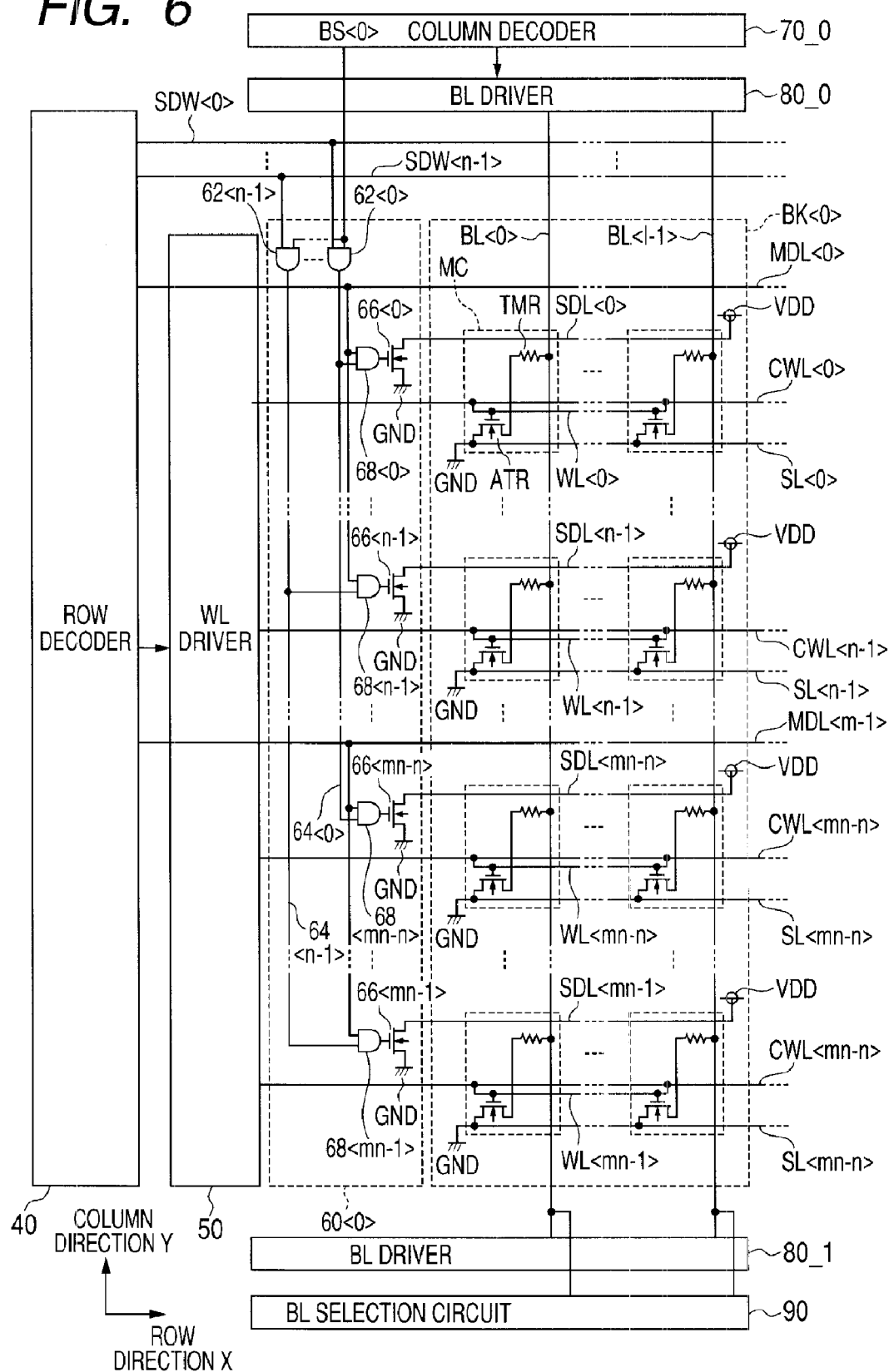
FIG. 6 is a circuit diagram showing the configurations of a memory block BK<0> and the corresponding digit line driver 60<0> shown in FIG. 5.

Further, in the row direction X of the memory array 10_0, m×n word lines WL<0> to WL<mn−1> (also generically called the word line WL) are provided corresponding to the memory cell rows respectively in each memory block BK, as will be shown in FIG. 6. Further, m×n common word lines CWL<0> to CWL<mn−1> (also generically called the common word line CWL) are provided corresponding to the memory cell rows respectively and provided common to the k memory blocks BK in the memory array 10_0. The word line WL is integrated with the gate of the access transistor ATR and formed of polysilicon, polycide, or the like, whereas the common word line CWL is formed of a metallic material in an upper layer of the word line WL. The common word line CWL is electrically coupled at a plurality of points to the word line WL disposed in the same memory cell row. The common word line CWL is also called a shunt line CWL.

The memory array 10_0 further includes a word line driver 50, digit line drivers 60<0> to 60<k−1>, bit line drivers 80_0 and 80_1, and a bit line selection circuit 90.

The word line driver 50 is provided common to the k memory blocks BK, and disposed adjacent to the row decoder 40 in the first embodiment. The output nodes of the word line driver 50 are coupled to the common word lines CWL. If a read enable signal RE is activated, the row decoder 40 transmits a row selection signal on the basis of a row address signal RA to the word line driver 50. In response to the received row selection signal, the word line driver 50 activates a common word line CWL corresponding to the selected row to the H level. As a result, the word line WL electrically coupled at a plurality of points to the common word line CWL is activated, and the access transistor ATR of the memory cell MC of the selected row is brought into conduction.

The common word line CWL formed of a metallic material has a lower resistance than the word line WL formed of polysilicon, polycide, or the like. Accordingly, the common word line CWL can transmit signals at higher speed than the word line WL. In the first embodiment, the word line WL is electrically coupled at a plurality of points to the common word line CWL; therefore, it is possible to transmit an activation signal from the word line driver 50 at high speed to the farthest memory cell MC.

Further, with the use of the common word line CWL, the word line driver 50 for activating the common word line CWL can be disposed common to a plurality of memory blocks BK. This can reduce an area for disposing the word line driver 50, compared to the case where the word line driver 50 is disposed for each memory block BK to directly activate the word line WL.

The digit line drivers 60<0> to 60<k-1> (also generically called the digit line driver 60) are provided corresponding to the memory blocks BK<0> to BK<k-1> respectively. The m main digit lines MDL and the n signal lines for the sub-decode signal SDW are coupled to each of the digit line drivers 60<0> to 60<k-1>. Further, block selection signals BS<0> to BS<k-1> (also generically called the block selection signal BS) are supplied from the column decoder 70_0 to the digit line drivers 60<0> to 60<k-1> respectively. The column decoder 70_0 activates a block selection signal BS for a digit line driver 60 corresponding to a memory block BK (hereinafter also referred to as a selected memory block) including a selected memory cell.

The output nodes of the digit line drivers 60<0> to 60<k-1> are coupled to the sub-digit lines SDL of the corresponding memory block BK. Each digit line driver 60, if an activated block selection signal BS is supplied thereto, supplies a data write current through a sub-digit line SDL selected by a main decode signal on the main digit line MDL and a sub-decode signal SDW. Since a data write current does not flow through non-selected memory blocks BK, it is possible to reduce the power consumption of the entire MRAM section 6 and reduce the possibility of false writing.

As described above, in the memory array 10_0 according to the first embodiment, the sub-digit line SDL for supplying the data write current is provided individually for each memory block BK. This can reduce the wiring resistance of the digit line, compared to the case where the digit line is provided common to a plurality of memory blocks BK. As a result, the digit line driver 60 can supply a current large enough to write data, without increasing the voltage of a power node VDD.

The bit line drivers 80_0 and 80_1 are disposed on both sides of the memory blocks BK in the column direction Y. The output nodes of the bit line drivers 80_0 and 80_1 are coupled to the k×l bit lines BL<0> to BL<kl-1>. The bit line drivers 80_0 and 80_1 supply a data write current in a direction according to write data Din through a bit line BL corresponding to a selected column, based on a column selection signal from the column decoders 70_0 and 70_1 during data write.

The bit line selection circuit 90, in response to a column selection signal from the column decoder 70_1 during data read, functions as a gate for coupling a bit line BL corresponding to a selected column to the sense amplifier 20_0.

FIG. 6 is a circuit diagram showing the configurations of the memory block BK<0> and the corresponding digit line driver 60<0> shown in FIG. 5. FIG. 6 shows the configurations of the memory block BK<0> and the digit line driver 60<0> typifying the k memory blocks BK<0> to BK<k-1> and the k digit line drivers 60<0> to 60<k-1> shown in FIG. 5, respectively.

Referring to FIG. 6, in the memory block BK<0>, a plurality of memory cells MC are disposed at the respective intersections of the 1 bit lines BL<0> to BL<l-1> and the m×n common word lines CWL<0> to CWL<mn-1>.

Each word line WL to which the gates of the access transistors ATR of memory cells MC are coupled is electrically coupled at a plurality of points to a corresponding common word line CWL. Each source line SL<0> to SL<mn-1> (also generically the called source line SL) to which the sources of the access transistors ATR of memory cells MC are coupled is disposed in the row direction X. One end of each source line SL is coupled to a ground node GND.

Each sub-digit line SDL is disposed in the row direction X and adjacent to the TMR elements of memory cells provided in a corresponding memory cell row. One end of each sub-digit line SDL is coupled to a power node VDD. The other end of each sub-digit line SDL is coupled to the drain of a corresponding drive transistor 66 provided in the digit line driver 60<0>.

The digit line driver 60<0> includes n AND gates 62<0> to 62<n-1> (also generically called the AND gate 62), m×n AND gates 68<0> to 68<mn-1> (also generically called the AND gate 68), and m×n drive transistors 66<0> to 66<mn-1> (also generically called the drive transistor 66).

The AND gates 62<0> to 62<n-1> are provided corresponding to n signal lines for sub-decode signals SDW<0> to SDW<n-1> respectively. The corresponding block selection signal BS<0> is inputted in common to one input terminals of the AND gates 62<0> to 62<n-1>, and the sub-decode signals SDW<0> to SDW<n-1> are inputted to the other input terminals respectively. The output terminals of the AND gates 62<0> to 62<n-1> are coupled to n signal lines 64<0> to 64<n-1> respectively. When the block selection signal BS<0> is activated to the H level and a corresponding sub-decode signal SDW is activated to the H level, the AND gate 62 activates the corresponding signal line 64 to the H level.

The AND gates 68<0> to 68<mn-1> are provided corresponding to the m×n sub-digit lines SDL<0> to SDL<mn-1> respectively. Therefore, as in the case of the sub-digit lines, it can be considered that n AND gates 68 configure one row group corresponding to a main digit line MDL.

A corresponding main digit line MDL is coupled in common to one input terminals of n AND gates 68 belonging to a same row group. The n signal lines 64<0> to 64<n-1> are coupled to the other input terminals of the n AND gates 68 belonging to the same row group, respectively. For example, the signal lines 64<0> to 64<n-1> are coupled to the other input terminals of the AND gates 68<0> to 68<n-1> corresponding to the main digit line MDL<0> respectively. Similarly, the signal lines 64<0> to 64<n-1> are coupled to the other input terminals of the AND gates 68<mn-n> to 68<mn-1> corresponding to the main digit line MDL<m-1> respectively.

The drive transistors 66 are N-channel MOS transistors. The output terminals of the AND gates 68<0> to 68<mn-1> are coupled to the gates of the drive transistors 66<0> to 66<mn-1> respectively. When the output terminal of an AND gate 68 is activated to the H level, the corresponding drive transistor 66 is brought into conduction. As a result, a data write current flows from the power node VDD through the sub-digit line SDL to the ground node GND.

With the above-described configuration of the digit line driver 60<0>, the AND gate 62 outputs the logical product of the block selection signal BS and the sub-decode signal SDW. Further, the AND gate 68 outputs the logical product of the output of the AND gate 62 and the main decode signal on the main digit line MDL. As a result, in accordance with the output of the AND gate 68, the data write current flows through the corresponding sub-digit line SDL. Thus, in the selection block selected by the column decoder 70, the data write current flows through the sub-digit line SDL corresponding to the selection row selected by the row decoder 40.

Next, the procedure for writing and reading data to and from a selected memory cell will be described with reference to a specific timing chart.

Figure 7:
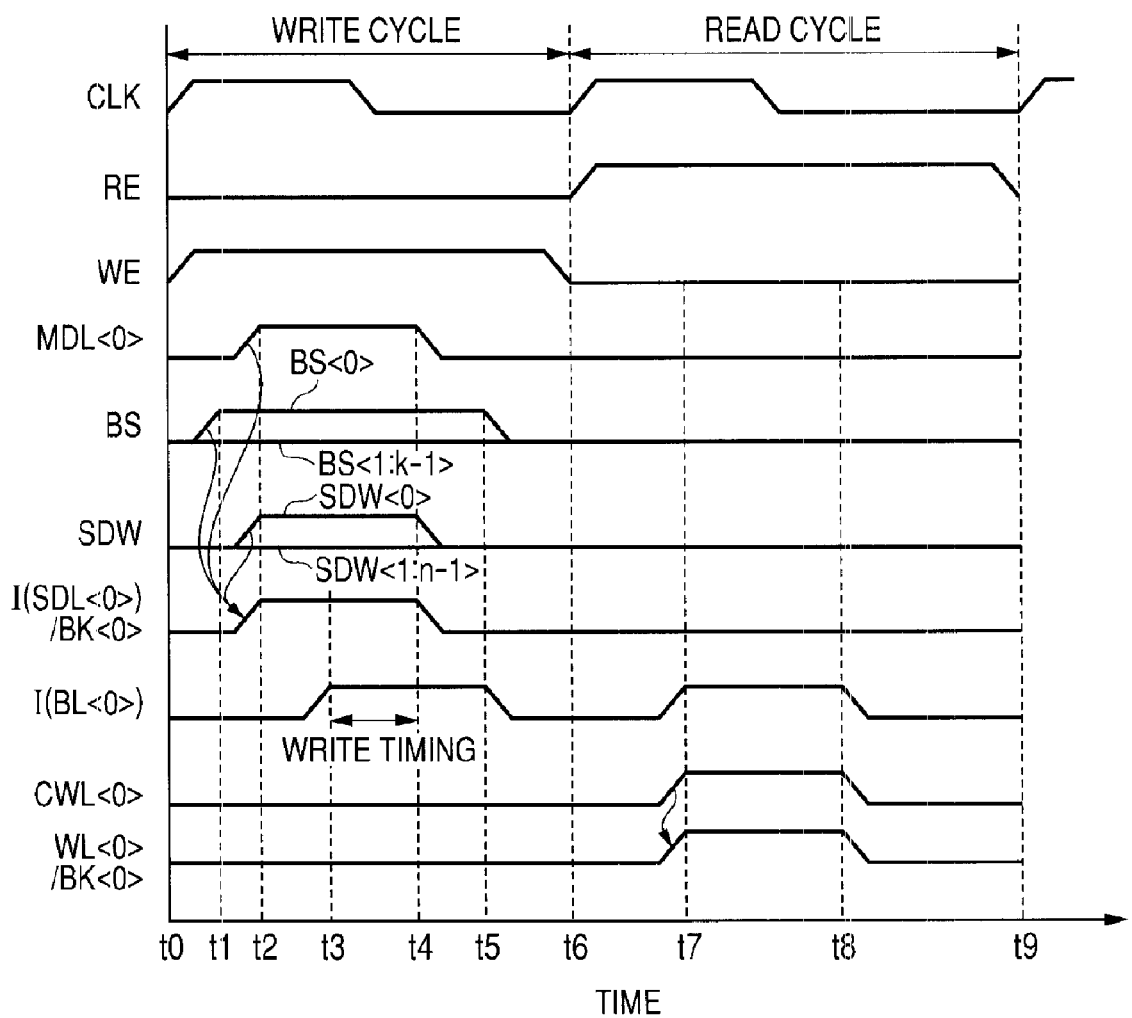
FIG. 7 is a timing chart showing the operation of writing and reading data to and from a memory cell MC in the memory array 10_0.

FIG. 7 is a timing chart showing the operation of writing and reading data to and from a memory cell MC in the memory array 10_0. In FIG. 7, the horizontal axis represents the time, and the vertical axis represents, from top down, the clock signal CLK, the read enable signal RE, the write enable signal WE, the voltage waveform of the main digit line MDL<0>, the voltage waveform of the block selection signal BS, the voltage waveform of the sub-decode signal SDW, the current waveform I (SDL<0>) of the sub-digit line SDL<0> in the memory block BK<0>, the current waveform I (BL<0>) of the bit line BL<0>, the voltage waveform of the common word line CWL<0>, and the voltage waveform of the word line WL<0> in the memory block BK<0>.

Hereinafter, referring to FIGS. 5 to 7, description will be made of the procedure for writing and reading data to and from a memory cell MC disposed adjacent to the intersection of the word line WL<0> and the bit line BL<0> selected from among a plurality of memory cells MC disposed in the memory block BK<0> shown in FIG. 6.

In FIG. 7, data write/read is performed in synchronization with the clock signal CLK. The time period from t0 to t6 over which the write enable signal WE is at the H level is a write cycle in which data is written to the selected memory cell. The time period from t6 to t9 over which the read enable signal RE is at the H level is a read cycle in which data is read from the selected memory cell. First, the data write cycle will be described.

At time t1, the column decoder 70_0 activates the block selection signal BS<0> to the H level. At this time, the other block selection signals BS<1> to BS<k−1> are maintained at the L level. Thereby, the memory block BK<0> (the selected memory block) including the selected memory cell is selected.

At time t2, the row decoder 40 activates the main digit line MDL<0> and the sub-decode signal SDW<0> to the H level. This brings the outputs of the AND gates 62<0> and 68<0> in the digit line driver 60<0> to the H level, which brings into conduction the drive transistor 66<0> coupled to the sub-digit line SDL<0>. As a result, a data write current flows through the sub-digit line SDL<0>.

At time t3, the bit line drivers 80_0 and 80_1 supply a data write current in a direction according to write data Din through the bit line BL<0> corresponding to the selected column, in response to a column selection signal from the column decoders 70_0 and 70_1. As a result, the data write currents flow through the sub-digit line SDL<0> and the bit line BL<0> so that data is written to the selected memory cell disposed adjacent to the intersection of both lines.

At time t4, the row decoder 40 deactivates the main digit line MDL<0> and the sub-decode signal SDW<0> to the L level. This returns the outputs of the AND gates 62<0> and 68<0> in the digit line driver 60<0> to the L level, which brings the drive transistor 66<0> out of conduction. As a result, the current I (SDL<0>) of the sub-digit line SDL<0> in the memory block BK<0> stops, and the writing of data to the selected memory cell ends.

At time t5, the column decoders 70_0 and 70_1 bring the block selection signal BS<0> to the L level. Further, the column decoders 70_0 and 70_1 stop the bit line drivers 80_0 and 80_1 from supplying the current I (BL<0>) through the bit line BL<0>.

Next, the data read cycle will be described. At time t7, in response to a row selection signal from the row decoder 40, the word line driver 50 activates the common word line CWL<0> to the H level. This activates the word line WL<0> coupled to the common word line CWL<0> to the H level, which brings the access transistor ATR of the selected row into conduction. Further, in response to a column selection signal from the column decoder 70_1, the bit line selection circuit 90 couples the bit line BL<0> corresponding to the selected column to the sense amplifier 20_0. The sense amplifier 20_0 detects and amplifies the difference between a data read current flowing through the selected memory cell via the bit line BL<0> and a reference current.

At time t8, the common word line CWL<0> returns to the L level, which returns the word line WL<0> to the L level. This brings the access transistor ATR of the selected row out of conduction. Further, the bit line selection circuit 90 disconnects the bit line BL<0> from the sense amplifier 20_0.

Figure 8:
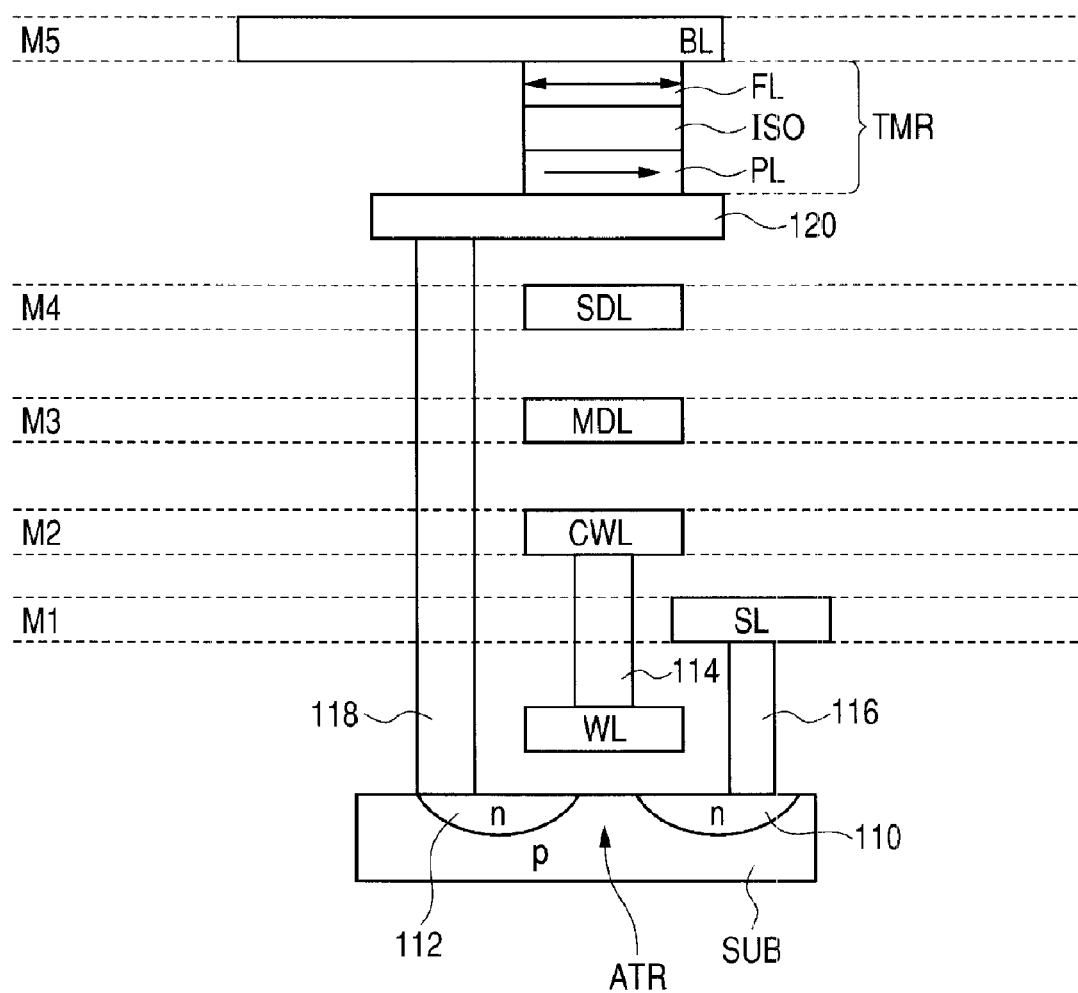
FIG. 8 is a sectional view of a memory cell MC according to the first embodiment.

FIG. 8 is a sectional view of a memory cell MC according to the first embodiment. In FIG. 8, an access transistor ATR is formed over the principal surface of a p-type semiconductor substrate SUB. The access transistor ATR has a source region 110 and a drain region 112 which are n-type regions and a gate. The gate is integrated with a word line WL. First to fifth metal wiring layers M1 to M5 are stacked through each interlayer insulating film, starting from the substrate side, over the principal surface of the semiconductor substrate SUB.

The source region 110 of the access transistor ATR is electrically coupled to a source line SL formed with the first metal wiring layer M1 through a metal film 116 formed in a contact hole. Further, the gate and the word line WL are electrically coupled to a common word line CWL formed with the second metal wiring layer M2 through a metal film 114 formed in a contact hole.

A main digit line MDL is formed with the third metal wiring layer M3 which is an upper layer of the common word line CWL. Further, a sub-digit line SDL is formed with the fourth metal wiring layer M4 which is an upper layer of the main digit line MDL.

A TMR element is disposed in an upper layer of the sub-digit line SDL. The TMR element has a pinned magnetic layer PL having a fixed magnetization direction and a free magnetic layer FL which is magnetized in a direction according to a data write magnetic field generated by a data write current. A tunnel barrier ISO formed of an insulation film is disposed between the pinned magnetic layer PL and the free magnetic layer FL.

The TMR element is electrically coupled to the drain region 112 of the access transistor ATR through a metal film 118 formed in a contact hole and a barrier metal 120. The barrier metal 120 is a buffer material for electrically coupling the TMR element to the metal film. A bit line BL is electrically coupled to the free magnetic layer FL of the TMR element and disposed in the fifth metal wiring layer M5 which is an upper layer of the TMR element.

Thus, the memory cell MC according to the first embodiment requires the five metal wiring layers M1 to M5 in total to form the source line SL, the common word line CWL, the main digit line MDL, the sub-digit line SDL, and the bit line BL.

As described above, in the MRAM section 6 of the semiconductor device 1 according to the first embodiment, the common word line CWL electrically coupled at a plurality of points to the word line WL is disposed common to a plurality of memory blocks BK. The word line driver 50 transmits an activation signal for the word line WL through the common word line CWL having a lower resistance than the word line WL. Accordingly, it is possible to enhance the transmission speed of the activation signal to the memory cell MC and enhance the reading speed of data from the memory cell MC.

Further, by using the common word line CWL, the word line driver 50 can be disposed common to a plurality of memory blocks BK. This can reduce an area for disposing the word line driver 50, compared to the case where the word line driver 50 is provided for each memory block BK to directly activate the word line WL.

On the other hand, the sub-digit line SDL for supplying a data write current during data write is provided individually for each memory block BK. This can reduce the wiring resistance of the digit line, compared to the case where the digit line is provided common to a plurality of memory blocks BK. As a result, it is possible to supply a current large enough to write data.

Further, with the use of the block selection signal BS on the basis of a row address, it is possible to supply the data write current through only the sub-digit line SDL provided in the memory block including the selected memory cell. As a result, it is possible to reduce the power consumption of the entire MRAM section 6 and reduce the possibility of false writing to non-selected memory cells MC.

Modification of First Embodiment

By modifying the shapes and arrangements of constituent elements in the memory array according to claim 1, it is possible to further enhance the integration density of the memory array. In this modification, the structure from the semiconductor substrate to the second metal wiring layer M2 in the sectional view of FIG. 8 is modified. More specifically, there are performed (i) interconnection of the source regions of memory cells, (ii) change of the wiring of the source line, and (iii) change of the shape and arrangement of the connection portion between the word line and the common word line. Hereinafter, detailed description will be made with reference to FIGS. 9 to 11. The connection portion is also called a common portion or a shunt portion.

Figure 9:
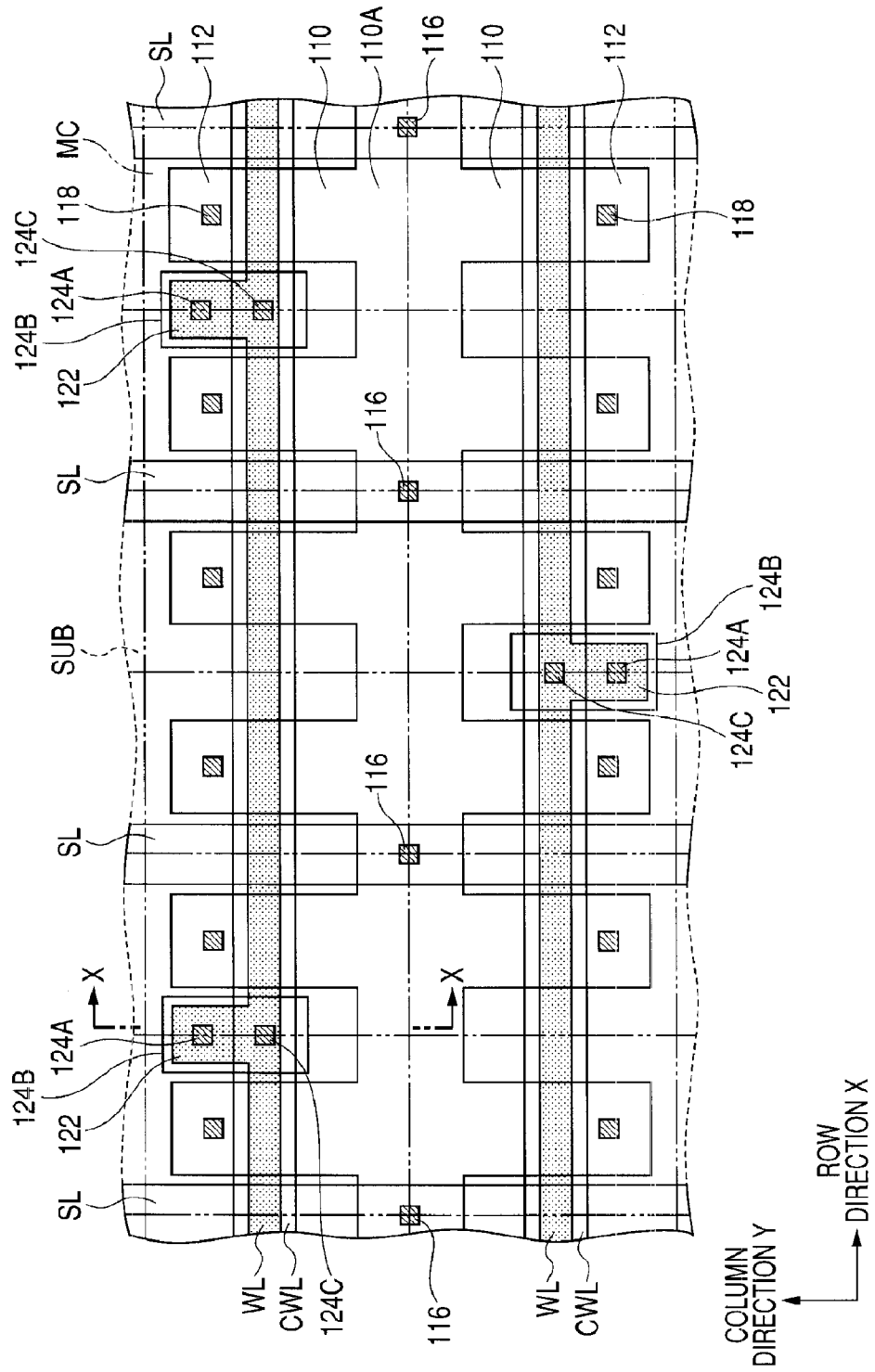
FIG. 9 is a plan view showing the pattern layout of a memory array according to a modification of the first embodiment.

FIG. 9 is a plan view showing the pattern layout of a memory array according to a modification of the first embodiment.

Figure 10:
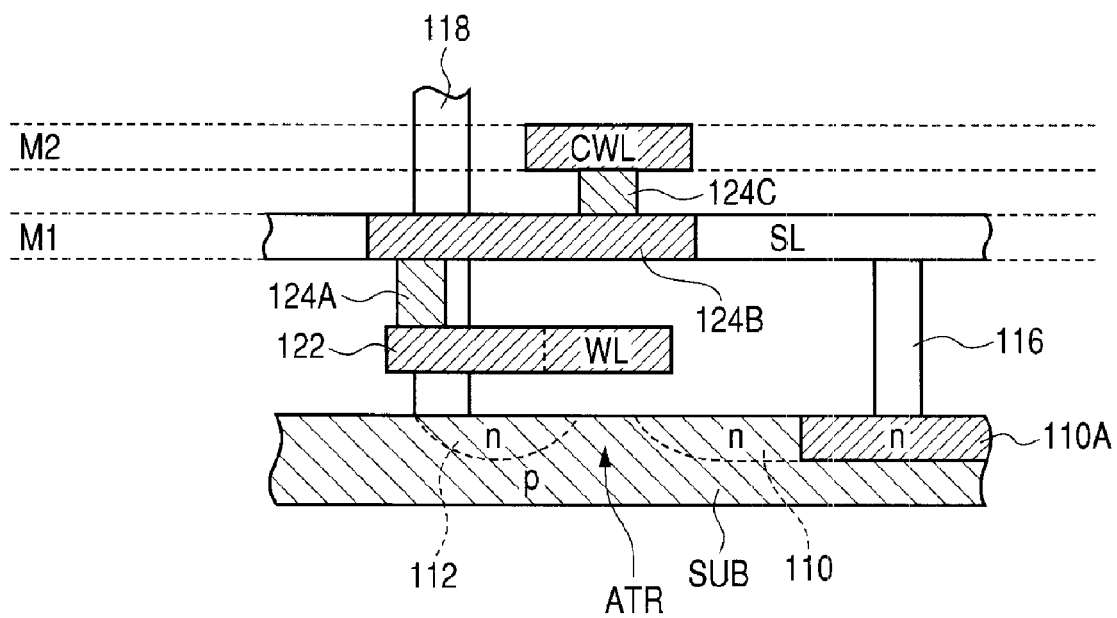
FIG. 10 is a sectional view taken along line X-X of FIG. 9.

FIG. 10 is a sectional view taken along line X-X of FIG. 9. FIGS. 9 and 10 show the memory array structure from the semiconductor substrate SUB to the second metal wiring layer M2 relating to this modification. In FIG. 9, the area of each memory cell MC is partitioned by chain double-dashed lines.

First, description will be made as to (i) interconnection of the source regions 110 of memory cells and (ii) change of the wiring of the source line SL.

As shown in FIGS. 9 and 10, each word line WL passes through the center of the memory cell MC of the corresponding row and extends in the row direction X. In each memory cell MC, the drain region 112 of the access transistor ATR is formed on one side of the word line WL, and the source region 110 is formed on the other side. In this case, adjacent memory cells MC in the Y direction are disposed such that the source regions 110 face each other.

Further, in this modification, an interconnection region 110A which is an n-type impurity region extending in the row direction X is formed along a boundary between adjacent memory cell rows. The interconnection region 110A is disposed every two memory cell rows. The interconnection region 110A is integrated with the source regions 110 of a plurality of memory cells MC adjacent to the interconnection region 110A. Thereby, a plurality of source regions are electrically coupled together through the interconnection region 110A.

Further, each source line SL formed with the first metal wiring layer M1 is formed along a boundary between adjacent memory cell columns, and extends in the column direction Y. In FIG. 9, a source line SL is disposed every two memory cell columns. The source line SL and the interconnection region 110A are coupled together at the intersection thereof through a metal film 116 formed in a contact hole. The source region 110 of each memory cell MC is electrically coupled to the ground node GND provided at one end of the source line SL.

As shown in FIG. 8, in the memory array according to the first embodiment, the source region 110 of each memory cell MC is individually coupled to the source line SL through the metal film 116 formed in the contact hole. On the other hand, in this modification, the source regions 110 of the memory cells MC are coupled together through the interconnection region 110A extending in the row direction X. The source lines SL are coupled to the interconnection region 110A. Accordingly, it is possible to reduce the number of source lines SL and the number of contact holes required to ground the source regions 110 of the memory cells MC.

Further, the drain region 112 of each memory cell MC is coupled to the TMR element (not shown) in an upper layer through the metal film 118 formed in the contact hole. This is the same as in the first embodiment.

Next, description will be made as to (iii) change of the shape and arrangement of the connection portion between the word line and the common word line.

As shown in FIGS. 9 and 10, the common word line CWL is formed with the second metal wiring layer M2, right over the word line WL. As viewed from the thickness direction of the semiconductor substrate SUB, the common word line CWL is formed wider than the word line WL so as to cover the word line WL.

In the first embodiment, as shown in FIG. 8, the common word line CWL is directly coupled to the word line WL through the metal film 114 formed in the contact hole. In this case, however, the smaller the width of the word line WL is, the more difficult it is to provide the contact hole over the word line WL.

For this reason, a plurality of rectangular protrusions 122 which protrude in the width direction (column direction Y) of the word line WL are provided to each word line WL shown in FIG. 9 in order to form contact holes. The protrusions 122 are disposed on part of the boundaries between adjacent memory cell columns other than the boundaries between memory cell columns having the source line SL. In this modification, one protrusion 122 is disposed every four memory cells MC in each word line WL.

The protruding direction of the protrusion 122 is a direction remote from the interconnection region 110A. If the protrusion 122 protrudes in a direction adjacent to the interconnection region 110A, a gate voltage applied to the word line WL affects a current flowing through the interconnection region 110A. Accordingly, the protruding directions of adjacent word lines WL are made opposite to each other to ensure a predetermined space between the word line WL and the interconnection region 110A.

Further, both the protrusions 122 of adjacent word lines WL are not disposed at a same boundary between memory cell columns. This prevents the following problem. If both the protrusions 122 of adjacent word lines WL are disposed at a same boundary between memory cell columns, the protrusions 122 are disposed adjacent to each other, which causes a gate voltage applied to one of the adjacent word lines WL to affect the other word line WL, leading to a malfunction.

As shown in FIGS. 9 and 10, the protrusion 122 is coupled to a metal film 124B formed in the first metal wiring layer M1 through a metal film 124A formed in a contact hole. Further, the metal film 124B formed in the first metal is coupled to the common word line CWL through a metal film 124C formed in a contact hole. Thus, the protrusion 122 of the word line WL is coupled to the common word line CWL through the connection portions 124A, 124B, and 124C (also generically called the connection portion 124). In this modification, the contrivance of the arrangement of the protrusion 122 prevents a new area penalty caused by the disposition of the protrusion 122.

Figure 11:
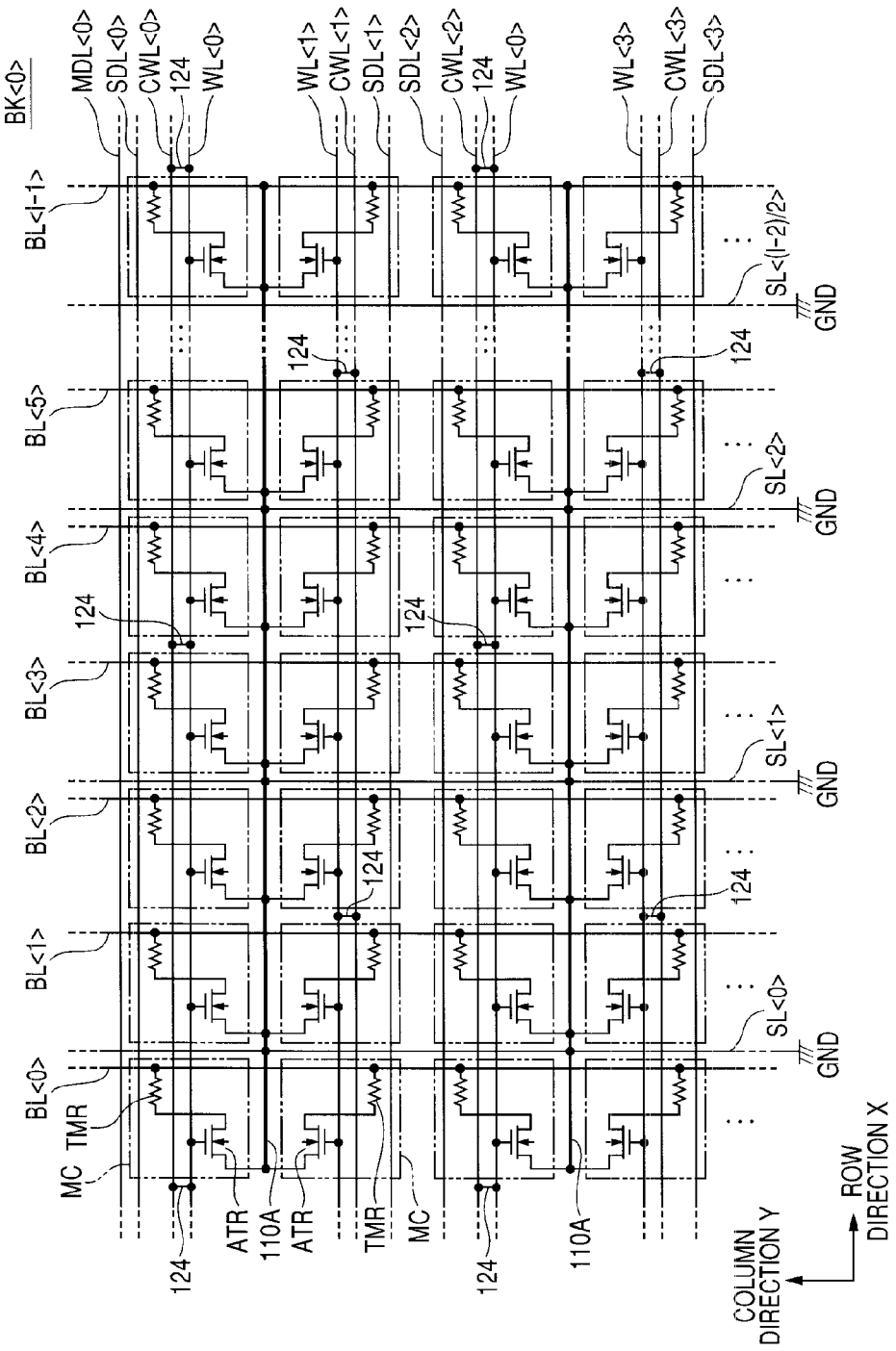
FIG. 11 is a circuit diagram of a memory block according to the modification of the first embodiment.

FIG. 11 is a circuit diagram of the memory block according to the modification of the first embodiment. FIG. 11 shows the circuit diagram corresponding to the memory block BK<0> shown in FIG. 6 and the connections between memory cells and lines.

Referring to FIG. 11, in the memory block BK<0>, a plurality of memory cells MC are disposed at the respective intersections of l (l is an even number not less than 4 in FIG. 11) bit lines BL<0> to BL<l−1> and m×n (m and n are integers not less than 2) common word lines CWL<0> to CWL<mn−1>. FIG. 11 illustrates only four common word lines CWL<0> to CWL<3>.

The word line WL to which the gates of the access transistors ATR of memory cells MC are coupled is coupled through a plurality of connection portions 124 to the corresponding common word line CWL. As described above, a connection portion 124 is disposed every four memory cells MC, at a boundary between adjacent memory cells. Further, the connection portions 124 of even-numbered word lines WL<0>, WL<2>, . . . are disposed in columns different from those where the connection portions 124 of odd-numbered word lines WL<1>, WL<3>, . . . are disposed. More specifically, as shown in FIG. 11, each source line SL is disposed between a column where a connection portion 124 of the even-numbered word lines WL are disposed and a column where a connection portion 124 of the odd-numbered word lines WL are disposed.

An interconnection region 110A is disposed every two memory cell rows, at a boundary between adjacent memory cell rows. For example, in FIG. 11, the interconnection region 110A is disposed between the zeroth memory cell row corresponding to the word line WL<0> and the first memory cell row corresponding to the word line WL<1>. Similarly, the interconnection region 110A is disposed between the second and third memory cell rows and between the fourth and fifth memory cell rows. The interconnection regions 110A are indicated by thick lines in FIG. 11. The sources of the access transistors ATR of memory cells MC on both sides of each interconnection region 110A are coupled to the interconnection region 110A.

Each source line SL<0> to SL<(l−2)/2> is disposed every two memory cell columns, at a boundary between adjacent memory cell columns. For example, in FIG. 11, the source line SL<0> is disposed between the zeroth memory cell column corresponding to the bit line BL<0> and the first memory cell column corresponding to the bit line BL<1>. Similarly, the source line SL<1> is disposed between the second and third memory cell columns, and the source line SL<2> is disposed between the fourth and fifth memory cell columns. The source lines SL and the interconnection regions 110A are coupled together at the intersections thereof. Further, one ends of the source lines SL are coupled to the ground node GND.

The others are the same as in the first embodiment. That is, each sub-digit line SDL is disposed in the row direction X and adjacent to the TMR elements of memory cells provided in a corresponding memory cell row. Further, one main digit line MDL is disposed every corresponding sub-digit lines SDL. In FIG. 11, the main digit line MDL<0> is provided corresponding to the sub-digit lines SDL<0> to SDL<3>.

As described above, in the memory array according to the modification of the first embodiment, the source regions 110 of a plurality of memory cells MC are coupled together through the interconnection region 110A extending in the row direction X. Further, the interconnection region 110A is coupled to the source line SL through the metal film 116 formed in the contact hole. Accordingly, it is possible to reduce the number of source lines SL and the number of contact holes required to ground the source regions 110 of the memory cells MC.

Further, a plurality of protrusions 122 which protrude in the width direction of the word line WL are provided to the word line WL in order to couple the word line WL to the common word line CWL. At this time, the contrivance of the arrangement of the protrusion 122 can prevent a new area penalty caused by the disposition of the protrusion 122.

Second Embodiment

Figure 12:
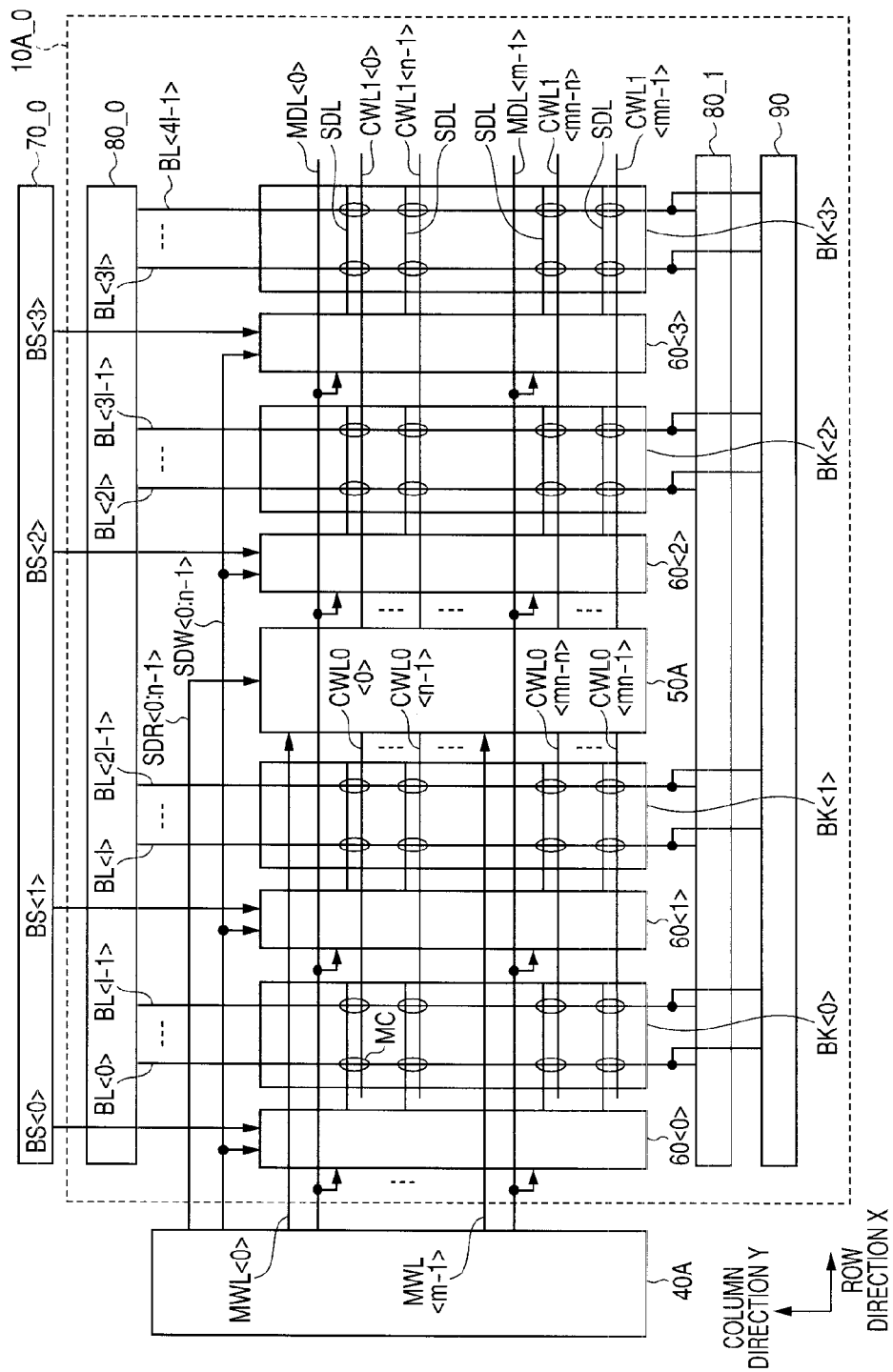
FIG. 12 is a diagram of assistance in explaining the configuration of a memory array 10A_0 according to a second embodiment.

FIG. 12 is a diagram of assistance in explaining the configuration of a memory array 10A_0 according to the second embodiment. The memory array 10_0 of FIG. 5 according to the first embodiment is modified into the memory array 10A_0 shown in FIG. 12.

In FIG. 12, as in the first embodiment, the memory array 10A_0 includes k (k is an integer not less than 2) memory blocks BK<0> to BK<k−1> (also generically called the memory block BK) disposed in the row direction X. To simplify the description, FIG. 12 illustrates the case where k=4.

Each memory block BK includes a plurality of memory cells MC arranged in matrix form in the X and Y directions. As shown in FIG. 12, in each memory block BK, m×n rows (m and n are integers not less than 2) by l columns (l is an integer not less than 2) of memory cells MC are disposed in the X and Y directions. In the entire memory array 10A_0, m×n rows by k×l columns (4×l columns in FIG. 12) of memory cells MC are disposed in the X and Y directions.

The memory array 10A_0 further includes a plurality of bit lines BL, the bit line drivers 80_0 and 80_1, and the bit line selection circuit 90, as in the first embodiment.

The bit lines BL are provided corresponding to the memory cell columns respectively. In the entire memory array 10A_0, k×l (=the number of memory cell columns) bit lines BL<0> to BL<kl−1> are disposed along the column direction Y.

The bit line drivers 80_0 and 80_1 are disposed on both sides of the memory blocks BK in the column direction Y. The output nodes of the bit line drivers 80_0 and 80_1 are coupled to the bit lines BL<0> to BL<kl−1>. The bit line drivers 80_0 and 80_1 supply a data write current in a direction according to write data Din through a bit line BL provided in a selected column, based on a column selection signal from the column decoders 70_0 and 70_1 during data write. The bit line selection circuit 90, in response to a column selection signal from the column decoder 70_1 during data read, functions as a gate for transmitting data on the bit line BL of a selected column to the sense amplifier 20_0.

The memory array 10A_0 further includes a plurality of main digit lines MDL, sub-digit lines SDL, and digit line drivers 60, as in the first embodiment.

The main digit lines MDL are provided common to the k (k=4 in the second embodiment) memory blocks BK. In the entire memory array 10A_0, the m main digit lines MDL<0> to MDL<m−1> are disposed along the row direction X.

On the other hand, the sub-digit lines SDL are disposed for each memory block BK. In each memory block, the m×n sub-digit lines SDL<0> to SDL<mn−1> are provided corresponding to the m×n memory cell rows respectively.

The m×n sub-digit lines SDL belonging to each memory block BK are divided into row groups of n adjacent sub-digit lines SDL. All the sub-digit lines SDL configure m row groups. The main digit lines MDL correspond to the m row groups respectively.

The digit line drivers 60<0> to 60<k−1> are provided corresponding to the memory blocks BK<0> to BK<k−1> respectively. As in the first embodiment, the digit line drivers 60 receive main decode signals on the main digit lines MDL and n-bit sub-decode signals SDW<0> to SDW<n−1> from a row decoder 40A during data write.

The digit line drivers 60<0> to 60<k−1> further receive the block selection signals BS<0> to BS<k−1> from the column decoder 70_0, respectively. One of the memory blocks BK is selected by a block selection signal BS. One of the above-described row groups disposed in the selected memory block BK is selected by a main decode signal on the main digit line MDL. Further, one sub-digit line SDL belonging to the selected row group is selected by a sub-decode signal SDW. The digit line driver 60 supplies a data write current through the selected sub-digit line SDL.

The memory array 10A_0 further includes a plurality of main word lines MWL, word lines WL, and common word lines CWL0, CWL1, and a word line driver 50A.

The word lines WL (shown in FIG. 13) are disposed for each memory block BK, as in the first embodiment. In each memory block BK, the m×n word lines WL<0> to WL<mn−1> are provided corresponding to the memory cell rows respectively. The word line WL is integrated with the gates of the access transistors ATR of memory cells provided in the corresponding memory cell row and formed of polysilicon, polycide, or the like.

On the other hand, the arrangement of the common word lines CWL0 and CWL1 and the word line driver 50A differs from that of the first embodiment. Further, in the second embodiment, m main word lines MWL<0> to MWL<m−1> are disposed along the row direction X.

The common word lines includes a plurality of first common word lines CWL0<0> to CWL0<mn−1> and a plurality of second common word lines CWL1<0> to CWL1<mn−1>.

The first common word lines CWL0 are provided common to a plurality of memory blocks BK disposed on one side in the row direction X (left side in FIG. 12) of the memory array 10A_0. The second common word lines CWL1 are provided common to a plurality of memory blocks BK other than the memory blocks BK of the first common word lines CWL0. It is preferable that the number of memory blocks BK of the first common word lines CWL0 is equal to the number of memory blocks BK of the second common word lines CWL1. The common word lines CWL0 and CWL1 are provided corresponding to the memory cell rows respectively. The common word lines CWL0 and CWL1 are formed of a metallic material and electrically coupled at a plurality of points to the word line WL disposed in a corresponding memory cell row.

The word line driver 50A is disposed between the memory blocks BK of the first common word lines CWL0 and the memory blocks BK of the second common word lines CWL1. For example, as shown in FIG. 12, in the case where the number of memory blocks BK is four (k=4), the word line driver 50A is disposed between the memory blocks BK<0>, BK<1> and the memory blocks BK<2>, BK<3>. In this case, the common word lines CWL0 and CWL1 extend on both sides of the word line driver 50A in the row direction X.

Thus, the common word line is divided in two, thereby reducing each wiring resistance of the common word lines CWL0 and CWL1 compared to that of the first embodiment. As a result, in the second embodiment, the common word line CWL transmits signals faster than in the first embodiment. Since the word line driver 50A is disposed in the center of the divided common word lines CWL, an area for disposing the word line driver 50A is almost the same as that of the first embodiment.

As in the case of the sub-digit line SDL, it can be considered that the common word lines CWL0 and CWL1 are divided into row groups of n adjacent common word lines. On one side in the row direction X (left side in FIG. 12) of the word line driver 50A, n common word lines CWL0 configure one row group. Further, on the other side in the row direction X (right side in FIG. 12) of the word line driver 50A, n common word lines CWL1 configure one row group.

The main word lines MWL are disposed between the row decoder 40A and the word line driver 50A, along the row direction X. The m main word lines MWL correspond to the m row groups configured by the common word lines CWL0 and the m row groups configured by the common word lines CWL1, respectively. For example, the main word line MWL<0> corresponds to a row group configured by the common word lines CWL0<0> to CWL0<n−1> and a row group configured by the common word lines CWL1<0> to CWL1<n−1>. Similarly, the main word line MWL<m-1> corresponds to a row group configured by the common word lines CWL0<mn−n> to CWL0<mn−1> and a row group configured by the common word lines CWL1<mn−n> to CWL1<mn−1>.

Main decode signals on the main word lines MWL and n-bit sub-decode signals SDR<0> to SDR<n−1> are used as row selection signals outputted from the row decoder 40A during data read. During data read, one of the row groups configured by the common word lines CWL0 and CWL1 is selected by a main decode signal on the main word line MWL. Further, among a plurality of common word lines CWL0 and CWL1 belonging to the selected row group, the common word lines CWL0 and CWL1 corresponding to a selected row are selected and activated by a sub-decode signal SDR.

Figure 13:
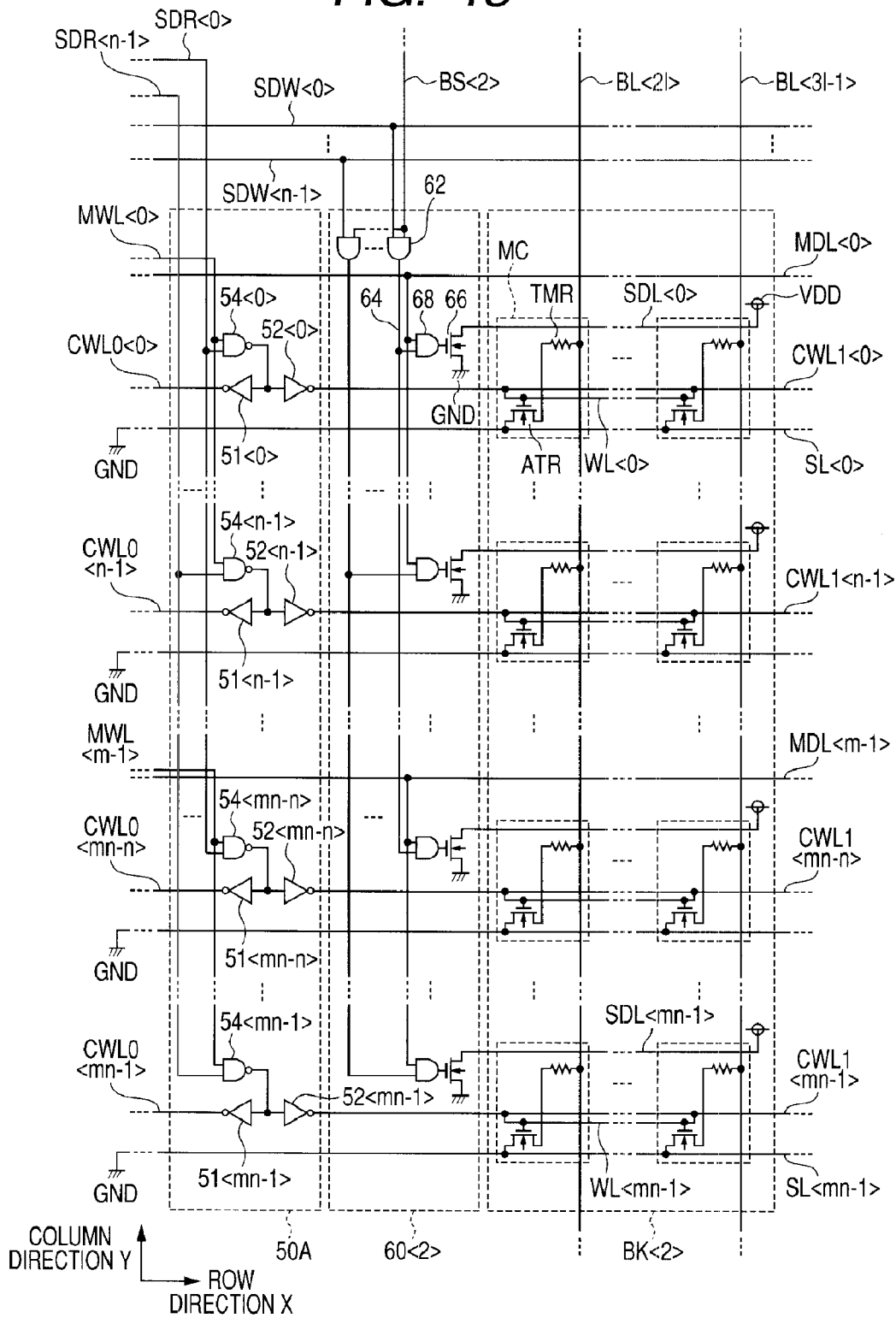
FIG. 13 is a circuit diagram showing the configurations of a memory block BK<2>, a digit line driver 60<2>, and a word line driver 50A shown in FIG. 12.

FIG. 13 is a circuit diagram showing the configurations of the memory block BK<2>, the digit line driver 60<2>, and the word line driver 50A shown in FIG. 12. The memory block BK<2> and the digit line driver 60<2> shown in FIG. 13 typify the memory blocks BK<0> to BK<3> and the digit line drivers 60<0> to 60<3> shown in FIG. 12, respectively. The configurations of the memory block BK<2> and the digit line driver 60<2> shown in FIG. 13 are the same as those illustrated in FIG. 6 in the first embodiment, and will not be described. Hereinafter, the configuration of the word line driver 50A will be described.

In FIG. 13, the word line driver 50A includes m×n inverters 51<0> to 51<mn−1> (also generically called the inverter 51), m×n inverters 52<0> to 52<mn631 1> (also generically called the inverter 52), and m×n NAND gates 54<0> to 54<mn−1> (also generically called the NAND gate 54).

The inverters 51<0> to 51<mn−1> are provided corresponding to the m×n common word lines CWL0<0> to CWL0<mn−1> disposed on one side in the row direction X, respectively. Similarly, the inverters 52<0> to 52<mn-1> are provided corresponding to the m×n common word lines CWL1<0> to CWL1<mn-1> disposed on the other side in the row direction X, respectively. Further, the NAND gates 54<0> to 54<mn-1> correspond to the m×n common word lines CWL0<0> to CWL0<mn-1> disposed on one side in the row direction X respectively, and also correspond to the m×n common word lines CWL1<0> to CWL1<mn-1> disposed on the other side.

As in the common word lines CWL0 and CWL1, it can be considered that the inverters 51 and 52 are divided into row groups of n inverters and the NAND gates 54 are divided into row groups of n NAND gates. One main word line MWL corresponds to each row group.

A corresponding main word line MWL is coupled in common to one input terminals of n NAND gates 54 belonging to a same row group. The n signal lines of the sub-decode signals SDR<0> to SDR<n-1> are coupled to the other input terminals of the n NAND gates 54 belonging to the same row group, respectively. For example, the signal lines of the sub-decode signals SDR<0> to SDR<n-1> are coupled to the other input terminals of the NAND gates 54<0> to 54<n-1> corresponding to the main word line MWL<0> respectively. Similarly, the signal lines of the sub-decode signals SDR<0> to SDR<n-1> are coupled to the other input terminals of the NAND gates 54<mn-n> to 54<mn-1> corresponding to the main word line MWL<m-1> respectively.

The output of the NAND gate 54 is branched, and one of the branched output is inputted to the inverter 51 to drive the common word line CWL0 corresponding to the inverter 51. The other one of the branched output is inputted to the inverter 52 to drive the common word line CWL1 corresponding to the inverter 52.

With the above-described configuration of the word line driver 50A, the output of the NAND gate 54 coupled to the activated main word line MWL and the activated signal line of the sub-decode signal SDR is activated to the L level. As a result, the outputs of the inverters 51 and 52 coupled to the activated NAND gate 54 are activated to the H level. In response to the outputs of the inverters 51 and 52, the common word lines CWL0 and CWL1 are activated to the H level. Thus, among a plurality of common word lines CWL0 and CWL1, the common word lines CWL0 and CWL1 corresponding to the selected row are activated by the main decode signal on the main word line MWL and the sub-decode signal SDR.

Next, the procedure for writing and reading data to and from a selected memory cell will be described with reference to a specific timing chart.

Figure 14:
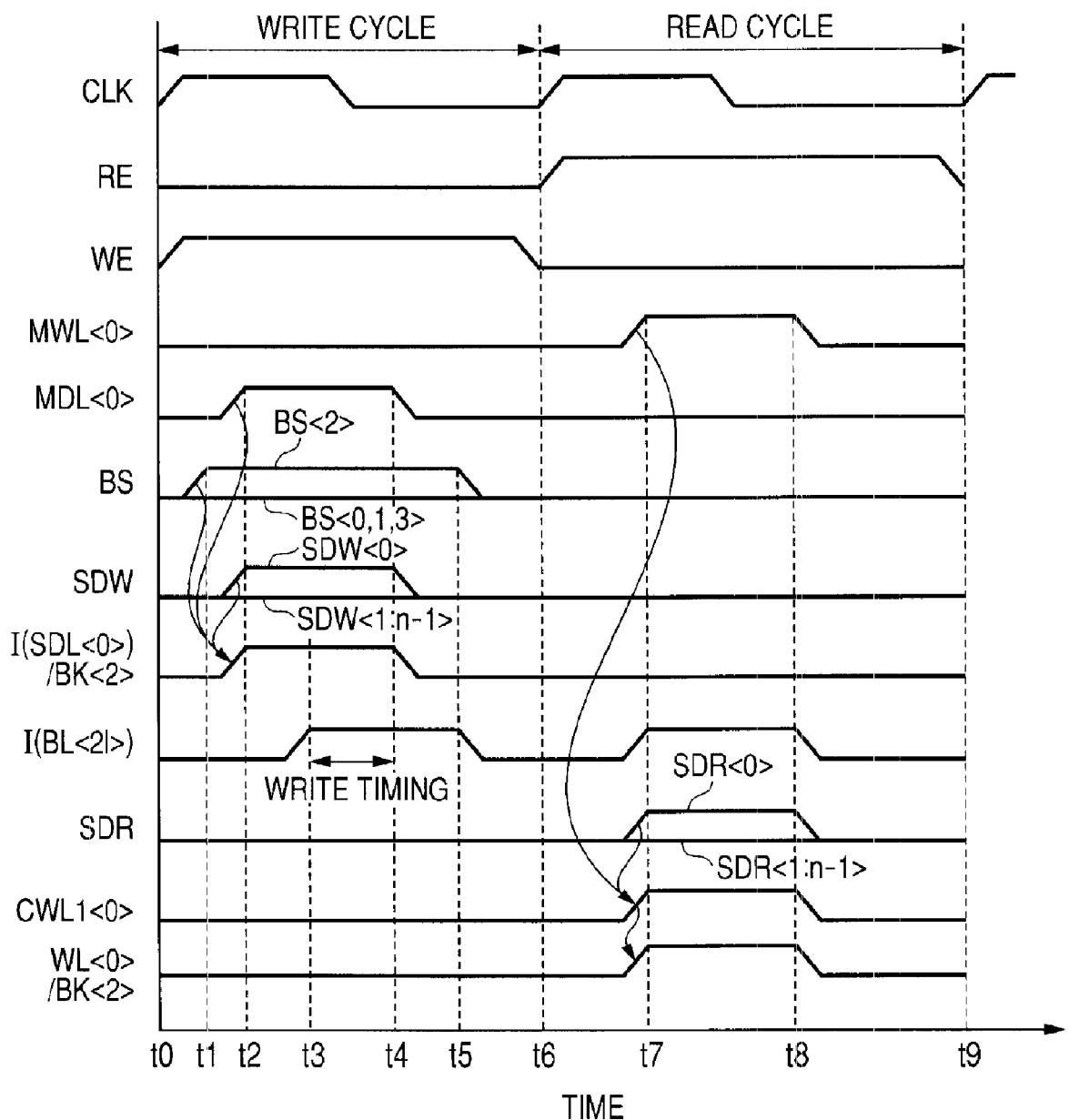
FIG. 14 is a timing chart showing the operation of writing and reading data to and from a memory cell MC in the memory array 10A_0.

FIG. 14 is a timing chart showing the operation of writing and reading data to and from a memory cell MC in the memory array 10A_0. In FIG. 14, the horizontal axis represents the time, and the vertical axis represents, from top down, the clock signal CLK, the read enable signal RE, the write enable signal WE, the voltage waveform of the main word line MWL<0>, the voltage waveform of the main digit line MDL<0>, the voltage waveform of the block selection signal BS, the voltage waveform of the sub-decode signal SDW, the current waveform I (SDL<0>) of the sub-digit line SDL<0> in the memory block BK<2>, the current waveform I (BL<21>) of the bit line BL<21>, the voltage waveform of the sub-decode signal SDR, the voltage waveform of the common word line CWL1<0>, and the voltage waveform of the word line WL<0> in the memory block BK<2>.

Hereinafter, referring to FIGS. 12 to 14, description will be made of the procedure for writing and reading data to and from a memory cell MC disposed adjacent to the intersection of the common word line CWL1<0> and the bit line BL<21> selected from among a plurality of memory cells MC disposed in the memory block BK<2> shown in FIG. 13.

In FIG. 14, data write/read is performed in synchronization with the clock signal CLK. The time period from t0 to t6 over which the write enable signal WE is at the H level is a write cycle in which data is written to the selected memory cell. The time period from t6 to t9 over which the read enable signal RE is at the H level is a read cycle in which data is read from the selected memory cell. First, the data write cycle will be described.

At time t1, the column decoder 70_0 activates the block selection signal BS<2> to the H level. At this time, the other block selection signals BS<0>, BS<1>, and BS<3> are maintained at the L level. Thereby, the memory block BK (the selected memory block) including the selected memory cell is selected.

At time t2, the row decoder 40A activates the main digit line MDL<0> and the sub-decode signal SDW<0> to the H level. This brings the outputs of the AND gates 62<0> and 68<0> in the digit line driver 60<2> to the H level, which brings into conduction the drive transistor 66<0> coupled to the sub-digit line SDL<0>. As a result, a data write current flows through the sub-digit line SDL<0>.

At time t3, in response to a column selection signal on the basis of a column address signal CA from the column decoders 70_0 and 70_1, the bit line drivers 80_0 and 80_1 supply a data write current in a direction according to write data Din through the bit line BL<21>. As a result, the data write currents flow through the sub-digit line SDL<0> and the bit line BL<21> so that data is written to the selected memory cell disposed adjacent to the intersection of both lines.

At time t4, the row decoder 40A deactivates the main digit line MDL<0> and the sub-decode signal SDW<0> to the L level. This returns the outputs of the AND gates 62<0> and 68<0> in the digit line driver 60<2> to the L level, which brings the drive transistor 66<0> out of conduction. As a result, the current I (SDL<0>) of the sub-digit line SDL<0> in the memory block BK<2> stops, and the writing of data to the selected memory cell ends.

At time t5, the column decoders 70_0 and 70_1 bring the block selection signal BS<2> to the L level. Further, the column decoders 70_0 and 70_1 stop the bit line drivers 80_0 and 80_1 from supplying the current I (BL<21>) through the bit line BL<21>.

Next, the data read cycle will be described. At time t7, in response to a row selection signal from the row decoder 40A, the word line driver 50 activates the main word line MWL<0> and the sub-decode signal SDR<0> to the H level. This activates the common word lines CWL0<0> and CWL1<0> to the H level. As a result, the word line WL<0> coupled to the common word lines CWL0<0> and CWL1<0> is activated to the H level, which brings the access transistor ATR of the selected row into conduction. Further, in response to a column selection signal from the column decoder 70_1, the bit line selection circuit 90 couples the bit line BL<21> corresponding to the selected column to the sense amplifier 20_0. The sense amplifier 20_0 detects and amplifies the difference between a data read current flowing through the selected memory cell via the bit line BL<21> and a reference current.

At time t8, the common word line CWL<0> returns to the L level, which returns the word line WL<0> to the L level. This brings the access transistor ATR of the selected row out of conduction. Further, the bit line selection circuit 90 disconnects the bit line BL<21> from the sense amplifier 20_0.

Figure 15:
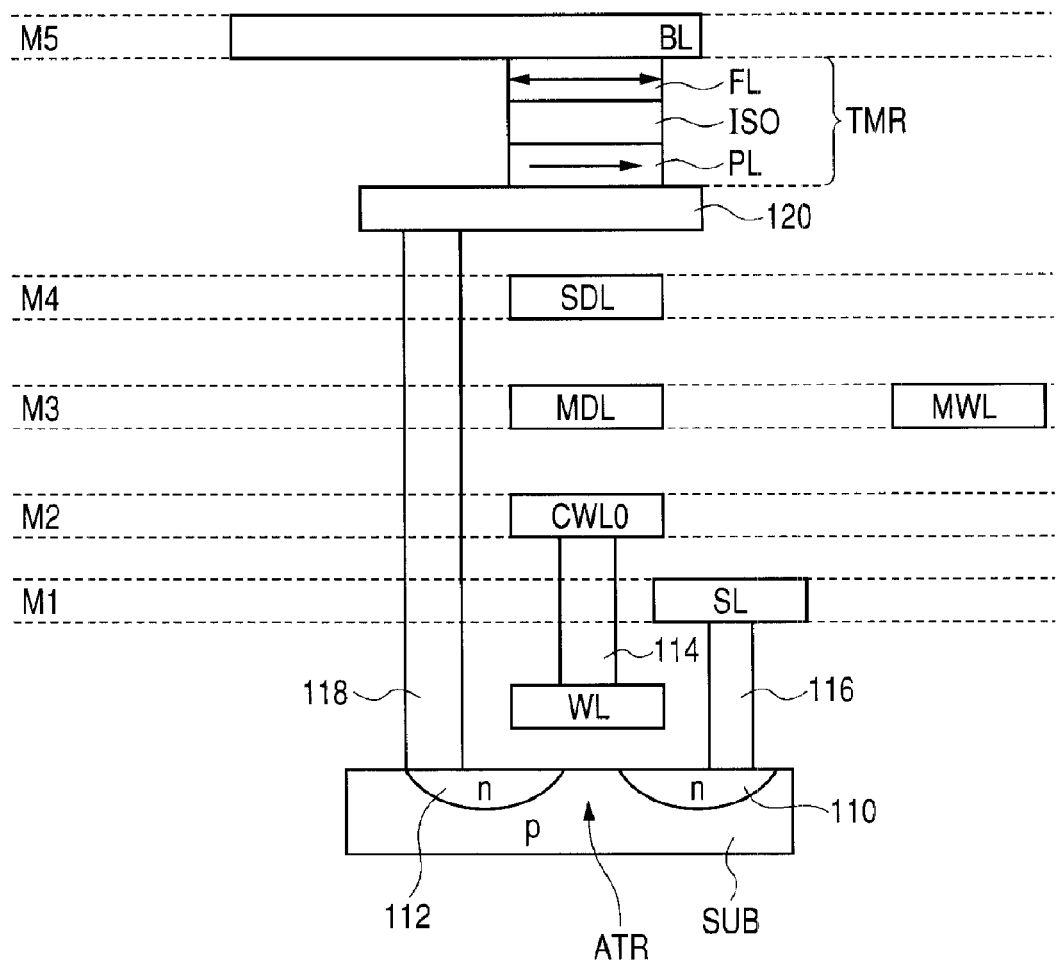
FIG. 15 is a sectional view of a memory cell MC according to the second embodiment.

FIG. 15 is a sectional view of a memory cell MC according to the second embodiment. FIG. 15 is a schematic sectional view of a memory cell MC disposed between the row decoder 40A and the word line driver 50A in the memory array 10A_0 shown in FIG. 12, taken along the column direction Y.

In FIG. 15, an access transistor ATR is formed over the principal surface of a p-type semiconductor substrate SUB. The access transistor ATR has a source region 110 and a drain region 112 which are n-type regions and a gate. The gate is integrated with a word line WL. First to fifth metal wiring layers M1 to M5 are stacked through each interlayer insulating film, starting from the substrate side, over the principal surface of the semiconductor substrate SUB.

The source region 110 of the access transistor ATR is electrically coupled to a source line SL formed with the first metal wiring layer M1 through a metal film 116 formed in a contact hole. Further, the gate and the word line WL are electrically coupled to a common word line CWL0 formed with the second metal wiring layer M2 through a metal film 114 formed in a contact hole.

A main digit line MDL and a main word line MWL are formed with the third metal wiring layer M3 which is an upper layer of the common word line CWL0. While m×n rows of memory cells MC are disposed in the row direction X, the total number of main digit lines MDL and main word lines MWL is 2×m. Therefore, it is fully possible to dispose these lines in the same metal wiring layer.

A sub-digit line SDL is formed with the fourth metal wiring layer M4. Further, a TMR element is disposed in an upper layer of the sub-digit line SDL. The TMR element has a pinned magnetic layer PL having a fixed magnetization direction and a free magnetic layer FL which is magnetized in a direction according to a data write magnetic field generated by a data write current. A tunnel barrier ISO formed of an insulation film is disposed between the pinned magnetic layer PL and the free magnetic layer FL.

The TMR element is electrically coupled to the drain region 112 of the access transistor ATR through a metal film 118 formed in a contact hole and a barrier metal 120. The barrier metal 120 is a buffer material for electrically coupling the TMR element to the metal film. A bit line BL is electrically coupled to the free magnetic layer FL of the TMR element and disposed in the fifth metal wiring layer M5 which is an upper layer of the TMR element.

Thus, as in the first embodiment, the memory cell MC according to the second embodiment requires the five metal wiring layers M1 to M5 in total to form the source line SL, the common word line CWL0, the main digit line MDL, the main word line MWL, the sub-digit line SDL, and the bit line BL.

As described above, in the MRAM section of the semiconductor device 1 according to the second embodiment, the common word line is divided in two, thereby reducing each wiring resistance of the common word lines CWL0 and CWL1 compared to that of the first embodiment. As a result, in the second embodiment, the common word line CWL transmits signals faster than in the first embodiment. Since the word line driver 50A is disposed in the center of the divided common word lines CWL, an area for disposing the word line driver 50A is almost the same as that of the first embodiment.

On the other hand, the sub-digit line SDL for supplying a data write current during data write is provided individually for each memory block BK, as in the first embodiment. This can reduce the wiring resistance of the digit line, compared to the case where the digit line is provided common to a plurality of memory blocks BK. As a result, it is possible to supply a current large enough to write data.

Further, as in the first embodiment, with the use of the block selection signal BS on the basis of a column address signal CA, it is possible to supply the data write current through only the sub-digit line SDL provided in the memory block BK including the selected memory cell. As a result, it is possible to reduce the power consumption of the entire MRAM section and reduce the possibility of false writing to non-selected memory cells MC.

The structure from the semiconductor substrate SUB to the second metal wiring layer M2 in the sectional view of FIG. 15 is the same as that in the sectional view of FIG. 8 according to the first embodiment. Therefore, as in the case of the modification of the first embodiment, by performing (i) interconnection of the source regions of memory cells, (ii) change of the wiring of the source line, and (iii) change of the shape and arrangement of the connection portion between the word line and the common word line, it is possible to further enhance the integration density of the memory array.

Modification of Second Embodiment

There are cases where a power supply voltage to the drive circuit of the digit line DL is set to be higher than a power supply voltage to the drive circuit of the word line WL in order to ensure a necessary and sufficient write current. Such a plurality of internal voltages are required, for example, to reduce the power consumption of the entire MRAM section.

More specifically, the power supply voltage coupled to the sub-digit line SDL in FIG. 13 is increased to VDD2. Further, in order to increase the gate drive voltage of the drive transistor 66 in the digit line driver 60, the power supply voltage for driving the AND gate 68 is increased to VDD2, and the voltage level of an input signal to the AND gate 68 is increased. Accordingly, in a modification of the second embodiment, the H-level voltage of a main decode signal is increased to VDD2 by a level shifter 45 provided in a row decoder 40B before the main decode signal is outputted to the main digit line MDL.

Figure 16:
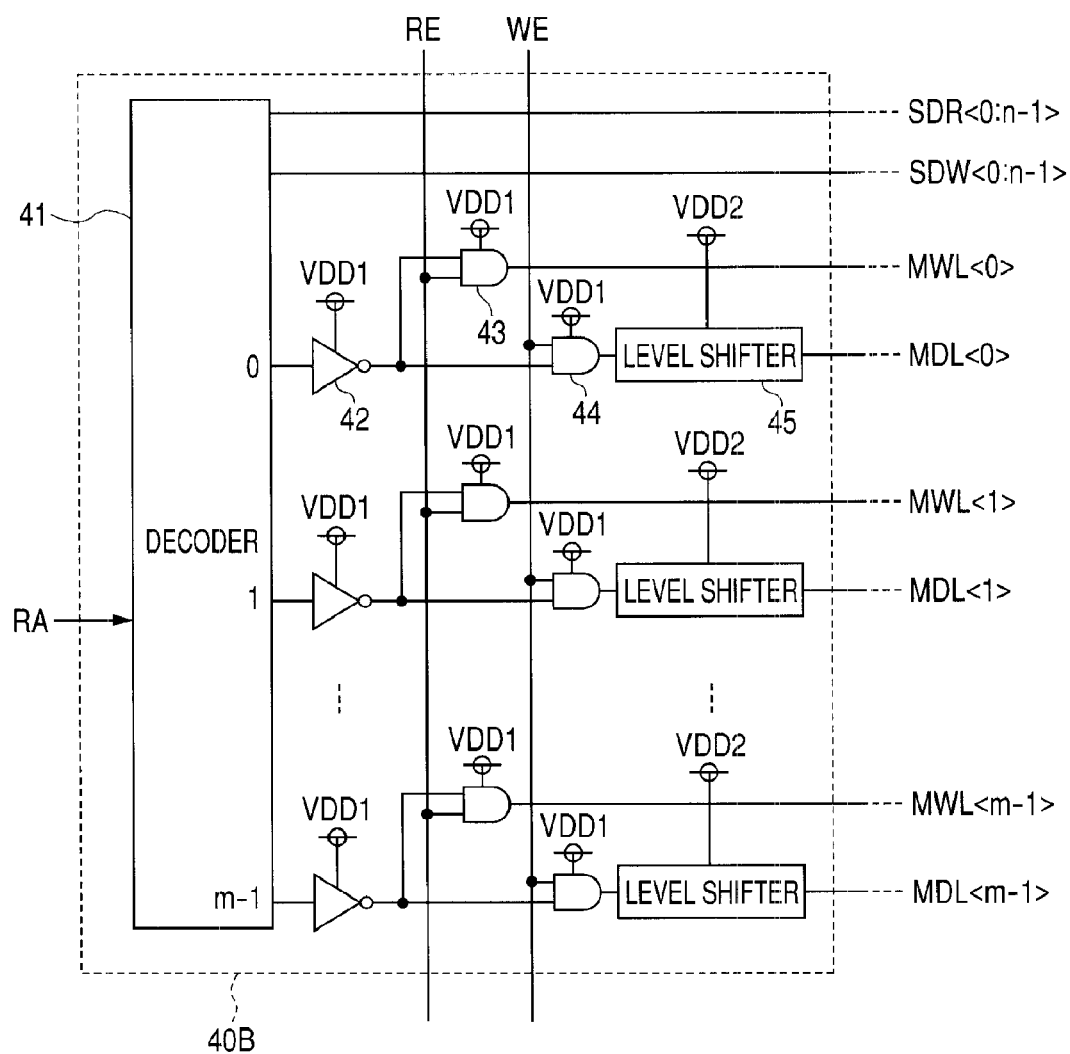
FIG. 16 is a block diagram schematically showing the configuration of a row decoder 40B according to a modification of the second embodiment.

FIG. 16 is a block diagram schematically showing the configuration of the row decoder 40B according to the modification of the second embodiment.

In FIG. 16, the row decoder 40B includes a decoder 41, m inverters 42, m AND gates 43, m AND gates 44, and m level shifters (voltage level shift circuits) 45. The operating voltage of the inverters 42, the AND gates 43, and the AND gates 44 is VDD1, and the operating voltage of the level shifters 45 is VDD2 which higher than VDD1.

The decoder 41 outputs a main decode result on the basis of a row address signal RA to the m inverters 42. The output signal of the inverter 42 is supplied to one input terminal of the corresponding AND gate 43 and one input terminal of the corresponding AND gate 44. Further, the read enable signal RE is supplied to the other input terminal of the AND gate 43, and the write enable signal WE is supplied to the other input terminal of the AND gate 44.

When the output of the inverter 42 is at the H level and the read enable signal RE is at the H level, the AND gate 43 outputs a main decode signal of the H level (voltage VDD1) to the main word line MWL.

On the other hand, when the output of the inverter 42 is at the H level and the write enable signal WE is at the H level, the output of the AND gate 44 becomes the H level (voltage VDD1). At this time, the level shifter 45 receives the output of the AND gate 44 and increases the voltage level to VDD2. Further, the level shifter 45 outputs a main decode signal of the increased voltage level to the main digit line MDL.

Figure 17:
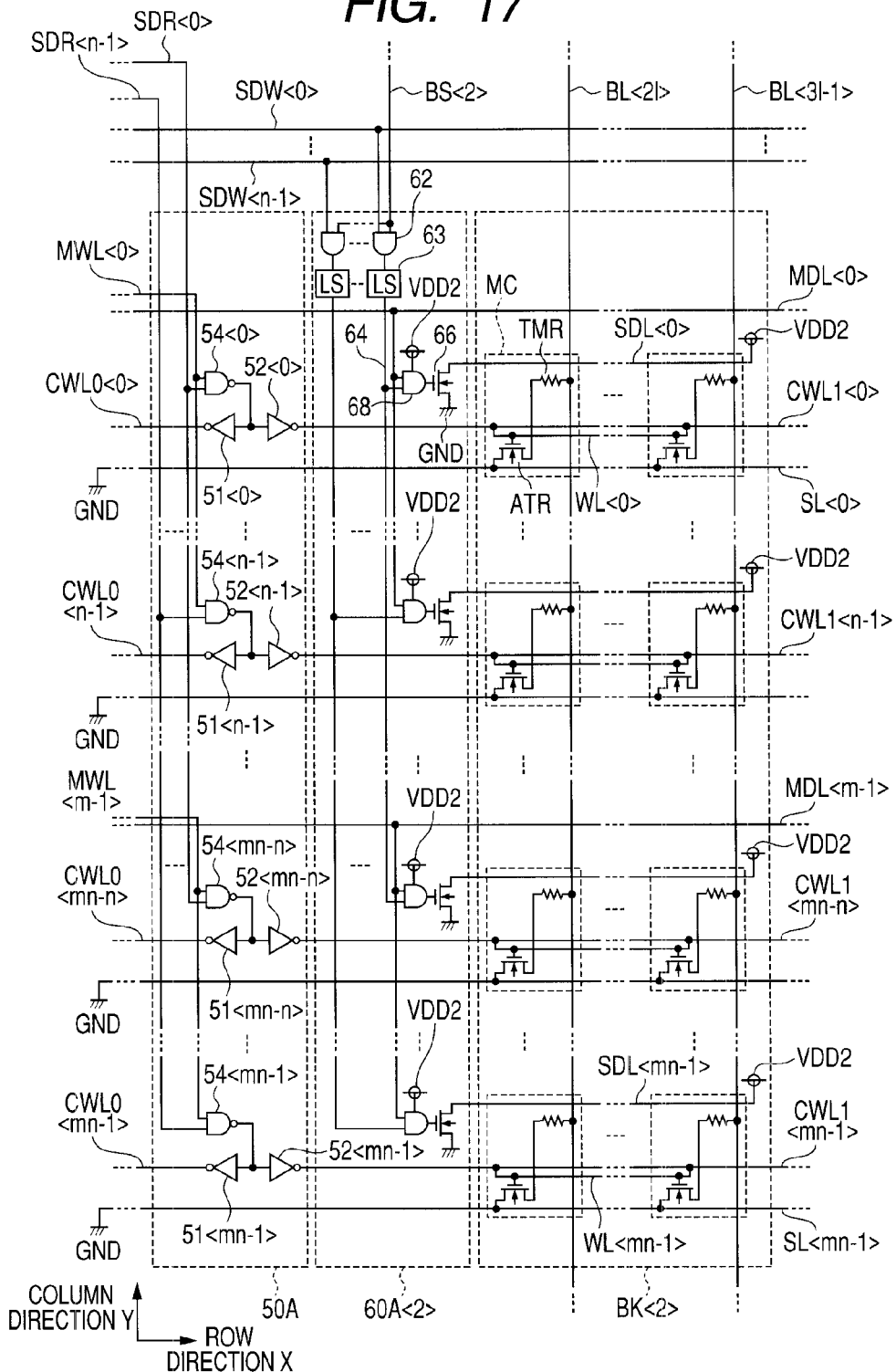
FIG. 17 is a circuit diagram showing the configurations of the memory block BK<2>, a digit line driver 60A<2>, and the word line driver 50A according to the modification of the second embodiment.

FIG. 17 is a circuit diagram showing the configurations of the memory block BK<2>, a digit line driver 60A<2>, and the word line driver 50A according to the modification of the second embodiment. The digit line drivers 60<0> to 60<3> according to the second embodiment are modified into the digit line drivers 60A<0> to 60A<3>. FIG. 17 shows the configuration of the digit line driver 60A<2> typifying the digit line drivers 60A<0> to 60A<3>.

In FIG. 17, the digit line driver 60A<2> includes n level shifters 63 provided at the outputs of the n AND gates 62, and differs from the digit line driver 60<2> of FIG. 13 in this respect. The level shifter 63 receives the output of the corresponding AND gate 62 and increases the voltage level to VDD2. Further, the level shifter 63 outputs a signal of the increased voltage level to the AND gate 68.

As described above, in the modification of the second embodiment, the voltage level of an input signal to the AND gate 68 needs to be increased to VDD2. For this reason, by disposing the level shifter 63, the H-level voltage of the other input signal to the AND gate 68 is increased to VDD2 as well as the main decode signal on the main digit line MDL. In this case, the H-level voltage of the sub-decode signal SDW and the block selection signal BS is VDD1 which is lower than VDD2. Further, the drive voltage of the AND gate 62 is VDD1.

Further, level shifters may be provided in the row decoder 40B and the column decoder 70_0 instead of in the digit line driver 60A<2> to increase the H-level voltage of the sub-decode signal SDW and the block selection signal BS to VDD2 beforehand. In this case, it is necessary to increase the drive voltage of the AND gate 62 to VDD2.

The other configurations in FIG. 17 are the same as those illustrated in FIG. 13 in the second embodiment, and will not be described.

Thus, in the modification of the second embodiment, the m level shifters 45 corresponding to the number of main digit lines MDL are provided in the row decoder 40B, thereby increasing the signal level of the main decode signal. Further, the n level shifters 63 are provided at the outputs of the n AND gates 62 for each memory block BK, thereby increasing the signal level of the sub-decode signal. As a result, it is possible to increase the gate drive voltage of the drive transistor 66 to increase the data write current flowing through the sub-digit line SDL.

Also by providing a level shifter just before the gate electrode of the drive transistor 66, it is possible to increase the gate drive voltage of the drive transistor 66. However, in this case, it is necessary to provide m×n level shifters corresponding to the number of drive transistors 66 for each memory block BK. Therefore, the modification of the second embodiment has an advantage of having a smaller number of level shifters compared to the case where the level shifter is provided just before the gate electrode of the drive transistor. Further, in the first embodiment as well, it is possible to increase the data write current flowing through the sub-digit line SDL in the same manner.

Third Embodiment

In the MRAM section 6 according to the first embodiment, by disposing the common word line CWL, it is possible to read data at high speed and reduce the area of the circuit for row selection. However, from the viewpoint of the memory cell structure, the MRAM section 6 according to the first embodiment requires a metal wiring layer for the common word line CWL, which leads to the five metal wiring layers in total.

In the MRAM section 6 according to the third embodiment, the digit line driver 60 transmits a row selection signal during data write through the common word line CWL. This negates the need for the main digit line MDL; accordingly, it is possible to reduce one metal wiring layer in the MRAM section 6 according to the first embodiment. Further, a latch circuit 92 is disposed to hold the active state of the common word line CWL, thereby making a contrivance of providing a lag between timing for activating the common word line CWL and timing for supplying a current through the bit line BL.

Figure 18:
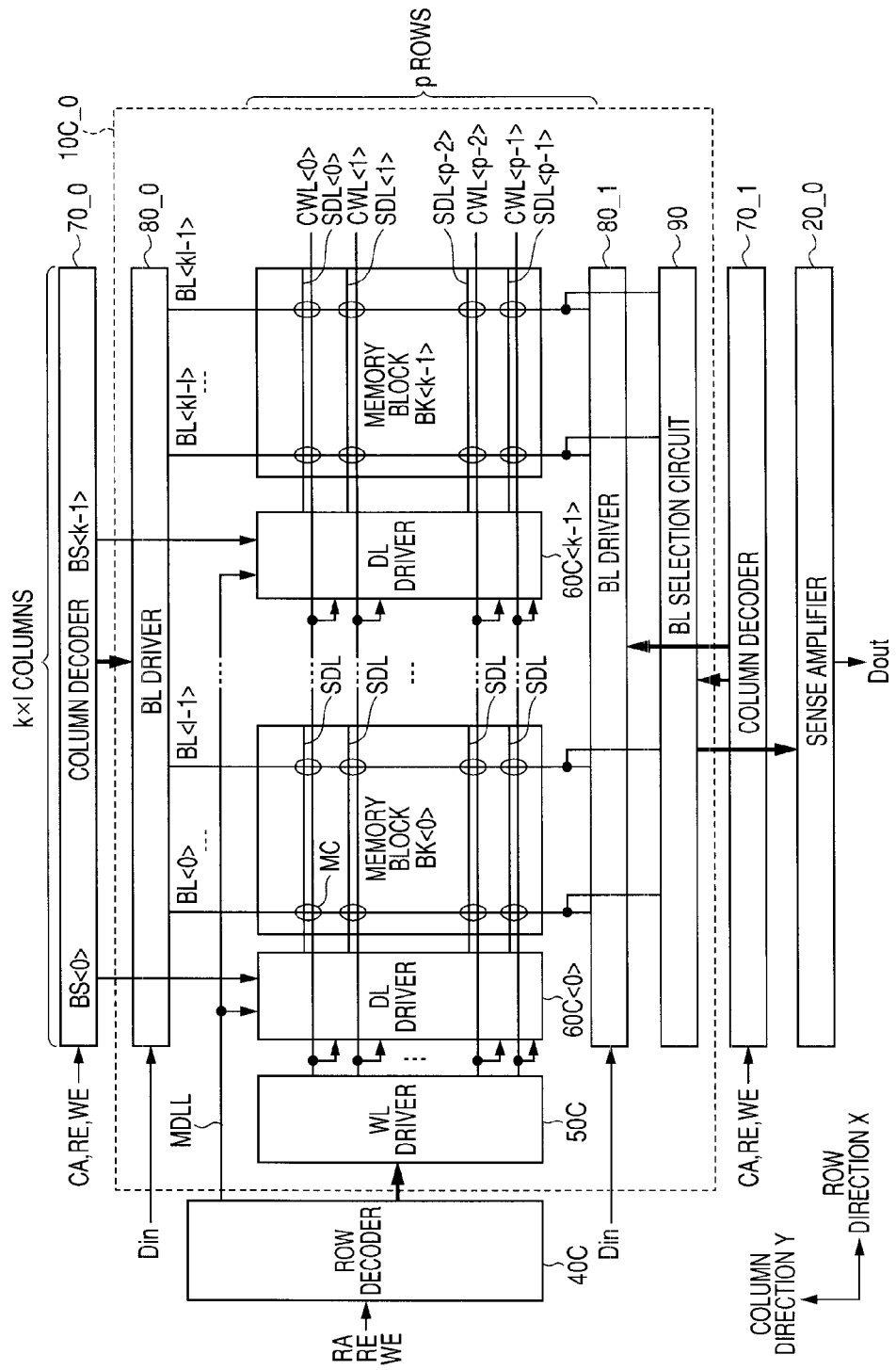
FIG. 18 is a diagram of assistance in explaining the configuration of a memory array 10C_0 according to a third embodiment.

FIG. 18 is a diagram of assistance in explaining the configuration of a memory array 10C_0 according to the third embodiment. The memory array 10C_0 shown in FIG. 18 is a modification of the memory array 10_0 of FIG. 5 according to the first embodiment.

In FIG. 18, as in the first embodiment, the memory array 10C_0 includes k (k is an integer not less than 2) memory blocks BK<0> to BK<k−1> (also generically called the memory block BK) disposed in the row direction X.

Each memory block BK includes a plurality of memory cells MC arranged in matrix form in the X and Y directions. As shown in FIG. 18, in each memory block BK, p rows (p is an integer not less than 2) by l columns (l is an integer not less than 2) of memory cells MC are disposed in the X and Y directions. In the entire memory array 10C_0, p rows by k×l columns of memory cells MC are disposed in the X and Y directions.

The memory array 10C_0 further includes a plurality of bit lines BL, the bit line drivers 80_0 and 80_1, and the bit line selection circuit 90, as in the first embodiment.

The bit lines BL are provided corresponding to the memory cell columns respectively. In the entire memory array 10C_0, k×l (=the number of memory cell columns) bit lines BL<0> to BL<kl−1> are disposed along the column direction Y.

The bit line drivers 80_0 and 80_1 are disposed on both sides of the memory blocks BK in the column direction Y. The output nodes of the bit line drivers 80_0 and 80_1 are coupled to the bit lines BL<0> to BL<kl−1>. The bit line drivers 80_0 and 80_1 supply a data write current in a direction according to write data Din through a bit line BL provided in a selected column, based on a column selection signal from the column decoders 70_0 and 70_1 during data write. The bit line selection circuit 90, in response to a column selection signal from the column decoder 70_1 during data read, functions as a gate for transmitting data on the bit line BL of a selected column to the sense amplifier 20_0.

The memory array 10C_0 further includes a plurality of word lines WL and common word lines CWL and a word line driver 50C.

The word lines WL (shown in FIG. 19) are disposed for each memory block BK, as in the first embodiment. In each memory block BK, p word lines WL<0> to WL<p−1> are provided corresponding to the memory cell rows respectively. The word line WL is integrated with the gates of the access transistors ATR of memory cells provided in the corresponding memory cell row and formed of polysilicon, polycide, or the like.

The common word lines CWL are disposed common to the k memory blocks BK, as in the first embodiment. In the entire memory array 10C_0, p common word lines CWL<0> to CWL<p−1> are provided corresponding to the memory cell rows respectively. The common word line CWL is formed of a metallic material and electrically coupled at a plurality of points to the word line WL disposed in the corresponding memory cell row.

The word line driver 50C is disposed common to the k memory blocks BK and adjacent to a row decoder 40C. The output nodes of the word line driver 50C are coupled to the common word lines CWL. During data read and during data write, the word line driver 50C receives a row selection signal on the basis of a row address signal RA from the row decoder 40C, and outputs it to the common word line CWL. Thus, the third embodiment differs from the first embodiment in that the common word line CWL transmits the row selection signal during data write as well as the row selection signal during data read.

The memory array 10C_0 further includes a plurality of sub-digit lines SDL and digit line drivers 60C.

The sub-digit lines SDL are disposed for each memory block BK, as in the first embodiment. In each memory block, p sub-digit lines SDL<0> to SDL<p−1> are provided corresponding to the p memory cell rows respectively.

The digit line drivers 60C<0> to 60C<k−1> are provided corresponding to the memory blocks BK<0> to BK<k−1> respectively. The digit line drivers 60C receive the row selection signal through the p common word lines CWL and receive a latch activation signal MDLL from the row decoder 40C. The latch activation signal MDLL is a signal for activating latch circuits (described later) disposed in each digit line driver 60C. The digit line drivers 60C<0> to 60C<k−1> further receive the block selection signals BS<0> to BS<k−1> from the column decoder 70_0, respectively.

During data write, one of the memory blocks BK is selected by a block selection signal BS. One of the p sub-digit lines SDL disposed in the selected memory block BK is selected by a row selection signal on the common word line CWL. The digit line driver 60C supplies a data write current through the selected sub-digit line SDL while the latch activation signal MDLL is activated.

Figure 19:
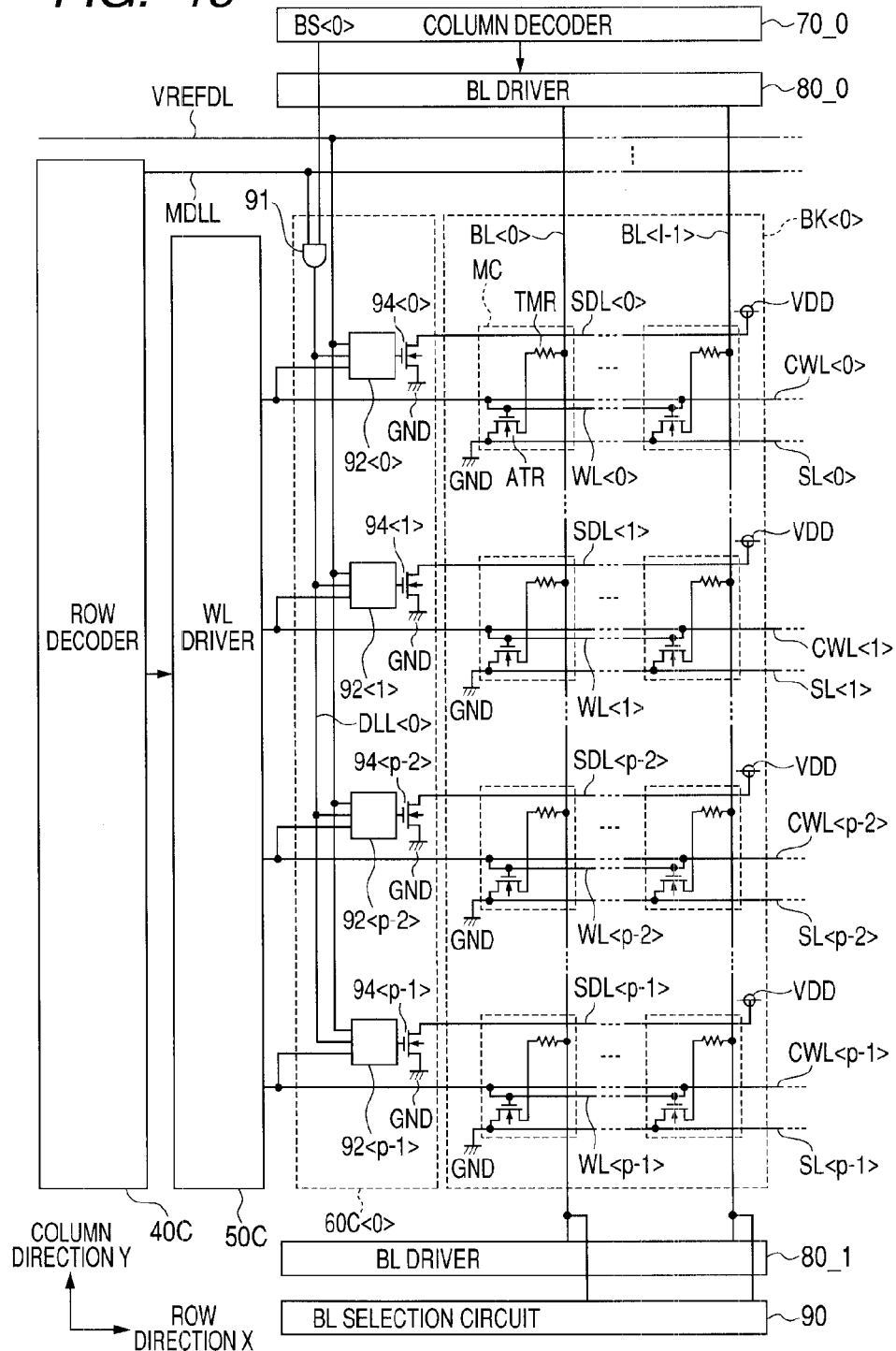
FIG. 19 is a circuit diagram showing the configurations of the memory block BK<0> and the corresponding digit line driver 60C<0> shown in FIG. 18.

FIG. 19 is a circuit diagram showing the configurations of the memory block BK<0> and the corresponding digit line driver 60C<0> shown in FIG. 18. The memory block BK<0> and the digit line driver 60C<0> shown in FIG. 19 typify the k memory blocks BK<0> to BK<k−1> and the k digit line drivers 60C<0> to 60C<k−1> shown in FIG. 18, respectively. The configuration of the memory block BK<0> shown in FIG. 19 is the same as that shown in FIG. 6 in the first embodiment, and will not be described. Hereinafter, the configuration of the digit line driver 60C<0> will be described.

In FIG. 19, the digit line driver 60C<0> includes an AND gate 91, p latch circuits 92<0> to 92<p−1> (also generically called the latch circuit 92), and p drive transistors 94<0> to 94<p−1> (also generically called the drive transistor 94).

The AND gate 91 receives the latch activation signal MDLL and the block selection signal BS<0> corresponding to the memory block BK<0>, and outputs a latch activation signal DLL<0> determined for each memory block BK. When both the latch activation signal MDLL and the corresponding block selection signal BS<0> are activated, the AND gate 91 activates the latch activation signal DLL<0>.

The latch circuits 92<0> to 92<p−1> are provided corresponding to the sub-digit lines SDL<0> to SDL<p−1> respectively. The latch circuit 92 receives the row selection signal on the common word line CWL, the latch activation signal DLL<0>, and a reference voltage VREFDL. The latch circuit 92 holds the active state of the common word line CWL while the latch activation signal DLL<0> is activated. The latch circuit 92 supplies the reference voltage VREFDL to the gate electrode of the drive transistor 94 for driving the corresponding sub-digit line SDL while holding the active state of the common word line CWL. The reference voltage VREFDL is supplied from the reference power supply 160 shown in FIG. 2.

The drive transistors 94<0> to 94<p−1> are provided corresponding to the sub-digit lines SDL<0> to SDL<p−1> respectively. When the reference voltage VREFDL is applied to the gate electrode, the drive transistor 94 is brought into conduction, and a data write current flows through the corresponding sub-digit line SDL.

Figure 20:
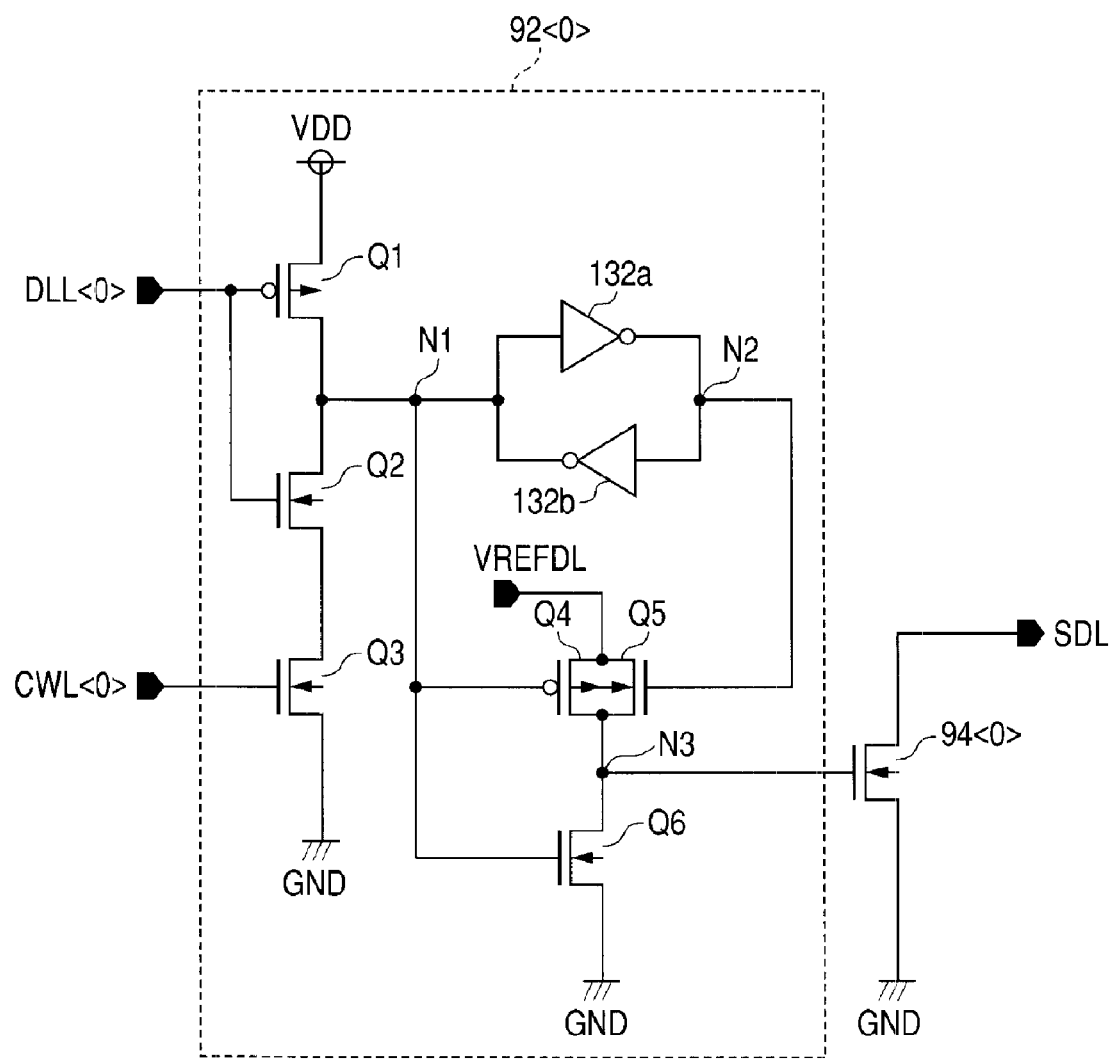
FIG. 20 is a circuit diagram showing the configuration of a latch circuit 92<0> in the digit line driver 60C<0> shown in FIG. 19.

FIG. 20 is a circuit diagram showing the configuration of the latch circuit 92<0> in the digit line driver 60C<0> shown in FIG. 19. The latch circuit 92<0> shown in FIG. 20 typifies the latch circuits 92 provided in the digit line drivers 60C<0> to 60C<k−1> shown in FIG. 18. The latch circuits 92 having the same configuration are provided in each digit line driver 60C.

In FIG. 20, the latch circuit 92<0> includes a p-channel MOS transistor Q1 and n-channel MOS transistors Q2 and Q3. The source of the MOS transistor Q1 is coupled to the power node VDD, and the drain thereof is coupled to a node N1. The MOS transistors Q2 and Q3 are coupled in series between the node N1 and the ground node GND. The gates of the MOS transistors Q1 and Q2 are coupled to the signal line of the latch activation signal DLL<0>. The gate of the MOS transistor Q3 is coupled to the corresponding common word line CWL<0>.

The latch circuit 92<0> further includes two inverters 132a and 132b, a p-channel MOS transistor Q4, and n-channel MOS transistors Q5 and Q6. The input terminal of the inverter 132a and the output terminal of the inverter 132b are coupled to the node N1. The input terminal of the inverter 132b and the output terminal of the inverter 132a are coupled to a node N2. The inverters 132a and 132b perform latching.

The MOS transistors Q4 and Q5 configure a CMOS transmission gate. These connections will be described. The source of the MOS transistor Q4 and the drain of the MOS transistor Q5 are coupled to the feeder line of the reference voltage VREFDL. Further, the drain of the MOS transistor Q4 and the source of the MOS transistor Q5 are coupled to a node N3. The gate of the MOS transistor Q4 is coupled to the node N1, and the gate of the MOS transistor Q5 is coupled to the node N2. The magnitude of the data write current flowing through the sub-digit line SDL during the conduction of the drive transistor 94<0> is adjusted by the set value of the reference voltage VREFDL.

Further, the MOS transistor Q6 is coupled between the node N3 and the ground node GND. The gate of the MOS transistor Q6 is coupled to the node N1. The node N3 is coupled to the gate of the drive transistor 94<0>.

Next, the operation of the latch circuit 92<0> will be described. If the signal line of the latch activation signal DLL<0> and the common word line CWL<0> are both at the H level, the MOS transistor Q1 is brought out of conduction and the MOS transistors Q2 and Q3 are brought into conduction. Accordingly, the node N1 becomes the L level, and the node N2 becomes the H level. Hereinafter, the state of these voltage levels of the node N1 and the node N2 is referred to as a first state. In the first state, the MOS transistors Q4 and Q5 are brought into conduction, and the MOS transistor Q6 is brought out of conduction. Therefore, the potential of the node N3 becomes equal to the reference voltage VREFDL, and the drive transistor 94<0> is brought into conduction. As a result, the data write current flows through the sub-digit line SDL.

When the common word line CWL<0> becomes the L level, the MOS transistor Q3 is brought out of conduction, but the first state is maintained as long as the signal line of the latch activation signal DLL<0> is at the H level.

When the signal line of the latch activation signal DLL<0> becomes the L level, the MOS transistor Q1 is brought into conduction and the MOS transistors Q2 is brought out of conduction. Accordingly, the node N1 becomes the H level, and the node N2 becomes the L level. Hereinafter, the state of these voltage levels of the node N1 and the node N2 is referred to as a second state. In the second state, the MOS transistors Q4 and Q5 are brought out of conduction, and the MOS transistor Q6 is brought into conduction. Therefore, the potential of the node N3 becomes equal to the ground potential GND, and the drive transistor 94<0> is brought out of conduction. As a result, the sub-digit line SDL is deactivated.

Thus, if the signal line of the latch activation signal DLL<0> is at the H level, the latch circuit 92<0> holds the active state of the common word line CWL<0> and enters the first state. In the first state, the corresponding sub-digit line SDL is activated so that the data write current flows through the sub-digit line SDL. On the other hand, if the signal line of the latch activation signal DLL<0> is at the L level, the latch circuit 92<0> enters the second state and deactivates the sub-digit line SDL.

Figure 21:
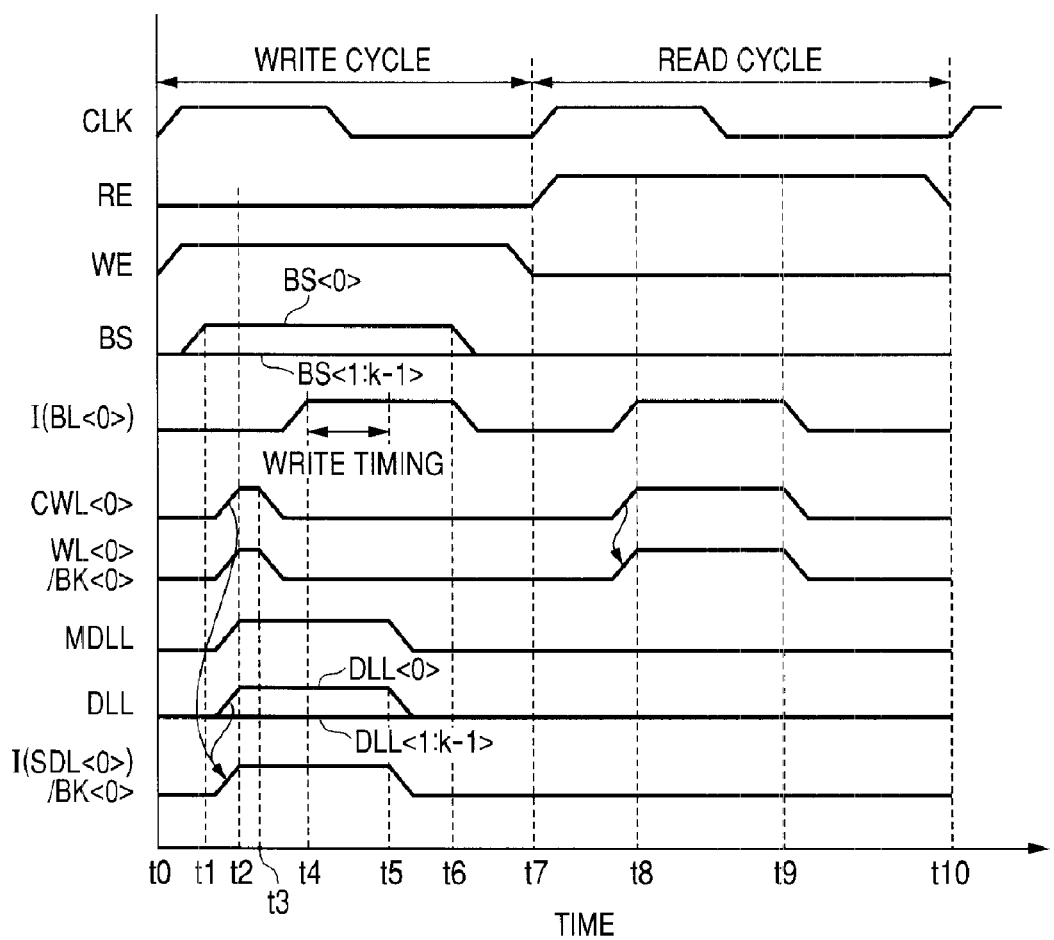
FIG. 21 is a timing chart showing the operation of writing and reading data to and from a memory cell MC in the memory array 10C_0.

Next, the procedure for writing and reading data to and from a selected memory cell will be described. FIG. 21 is a timing chart showing the operation of writing and reading data to and from a memory cell MC in the memory array 10C_0. In FIG. 21, the horizontal axis represents the time, and the vertical axis represents, from top down, the clock signal CLK, the read enable signal RE, the write enable signal WE, the voltage waveform of the block selection signal BS, the current waveform I (BL<0>) of the bit line BL<0>, the voltage waveform of the common word line CWL<0>, the voltage waveform of the word line WL<0> in the memory block BK<0>, the voltage waveform of the latch activation signal MDLL, the voltage waveform of the latch activation signal DLL for each memory block BK, and the current waveform I (SDL<0>) of the sub-digit line SDL<0> in the memory block BK<0>.

Hereinafter, referring to FIGS. 18, 19, and 21, description will be made of the procedure for writing and reading data to and from a memory cell MC disposed adjacent to the intersection of the word line WL<0> and the bit line BL<0> selected from among a plurality of memory cells MC disposed in the memory block BK<0> shown in FIG. 19. The data read cycle from t7 to t10 is the same as that shown in FIG. 7 in the first embodiment, and will not be described.

At time t1, the column decoder 70_0 activates the block selection signal BS<0> to the H level. At this time, the other block selection signals BS<1> to BS<k−1> remain deactivated at the L level. Thereby, the memory block BK<0> is selected.

At time t2, the digit line driver 60C<0> activates the common word line CWL<0> corresponding to the selected row to the H level, in response to a signal from the row decoder 40C. This activates the word line WL<0> in the memory block BK<0> to the H level.

Further, at time t2, the latch activation signal MDLL becomes the H level. Since the block selection signal BS<0> is maintained at the H level from time t1, the latch activation signal DLL<0> outputted from the AND gate 91 shown in FIG. 19 becomes the H level. As a result, the latch circuit 92<0> holds the active state of the common word line CWL<0>, and a data write current flows through the sub-digit line SDL<0> in the memory block BK<0>.

At time t3, the common word line CWL<0> returns to the L level and becomes deactivated. This returns the word line WL<0> in the memory block BK<0> to the L level. At time t3 since the latch activation signal MDLL is maintained at the H level, the data write current continues flowing through the sub-digit line SDL<0>.

At time t4, the bit line drivers 80_0 and 80_1 supply a data write current in a direction according to write data Din through the bit line BL<0> corresponding to the selected column, in response to a column selection signal from the column decoders 70_0 and 70_1.

At time t5, the latch activation signal MDLL returns to the L level, which returns the latch activation signal DLL<0> outputted from the AND gate 91 shown in FIG. 19 to the L level. Accordingly, the voltage supplied from the latch circuit 92<0> to the gate of the drive transistor 94<0> becomes the L level. As a result, the data write current flowing through the sub-digit line SDL<0> becomes zero, and the data writing ends.

At time t6, the block selection signal BS<0> becomes the L level, and the current flowing through the bit line BL<0> returns to the L level. Thereby, the data write cycle ends.

It is necessary to set the falling edge at time t3 of the voltage of the common word line CWL<0> prior to the rising edge of the current of the bit line BL<0>. The reason will be described below with reference to FIG. 22.

Figure 22:
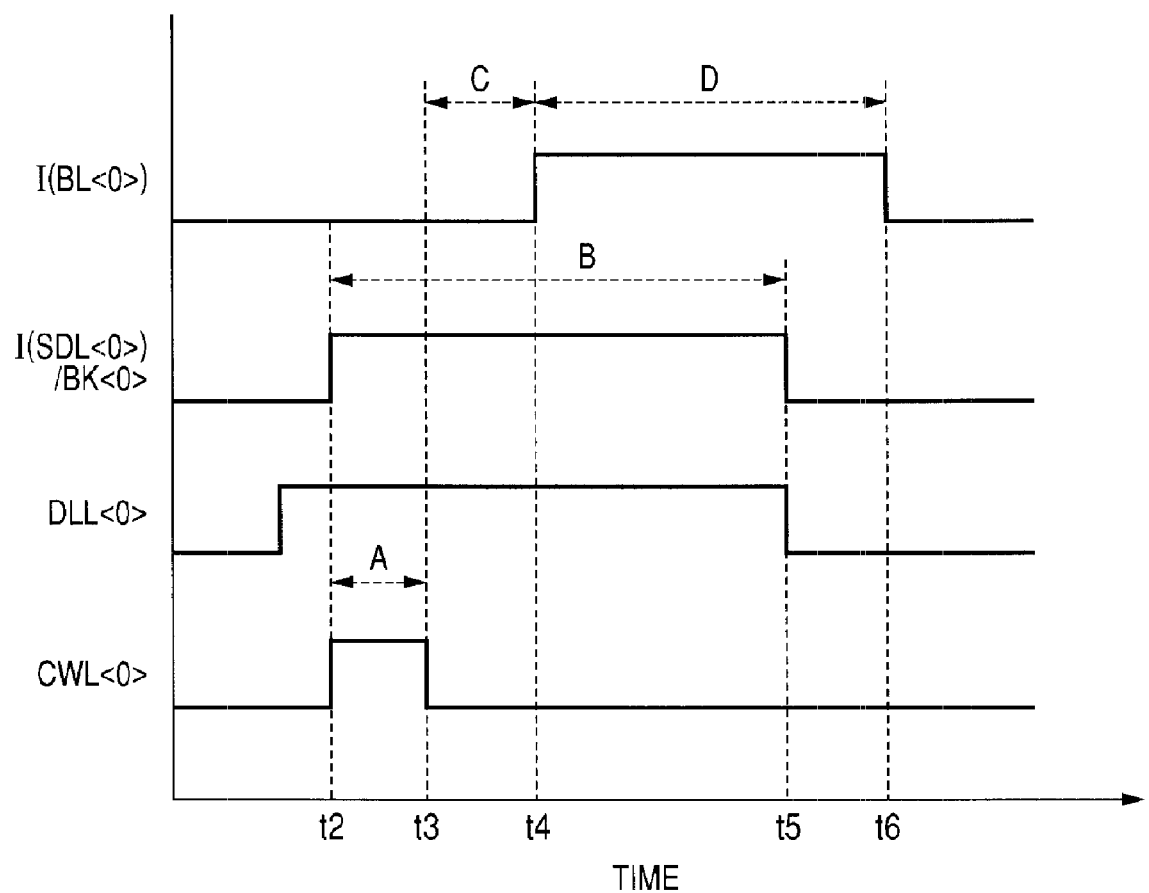
FIG. 22 is a timing chart of assistance in explaining the rising edge of the current flowing through a bit line BL<0> and the falling edge of the voltage of a common word line CWL<0>.

FIG. 22 is a timing chart of assistance in explaining the rising edge of the current flowing through the bit line BL<0> and the falling edge of the voltage of the common word line CWL<0>. In FIG. 22, the horizontal axis represents the time, indicating the time period from t2 to t6 in FIG. 21. The vertical axis represents, from top down, the current waveform I (BL<0>) of the bit line BL<0>, the current waveform I (SDL<0>) of the sub-digit line SDL<0> in the memory block BK<0>, the voltage waveform of the latch activation signal DLL<0>, and the voltage waveform of the common word line CWL<0>.

Referring to FIGS. 19 and 22, since both voltages of the latch activation signal DLL<0> and the common word line CWL<0> are at the H level in the time period A from t2 to t3, the latch circuit 92<0> holds the active state of the common word line CWL<0>. Further, since the common word line CWL<0> is at the H level in the time period A, the access transistor ATR of the memory cell MC coupled to the common word line CWL<0> is activated.

In the time period B from t2 to t5, the latch circuit 92<0> holds the active state. Accordingly, the drive transistor 94<0> corresponding to the latch circuit 92<0> in FIG. 19 is activated, and a data write current flows through the sub-digit line SDL<0> in the memory block BK<0>.

In the time period D from t4 to t6, a data write current flows through the bit line BL<0>. Therefore, in the time period from t4 to t5 which is common to the time period B and the time period D, data is written to the selected memory cell MC.

If the time t3 when the common word line CWL<0> falls to the L level is behind the time t4 when the data write current starts to flow through the bit line BL<0>, the data write current flows through the bit line BL<0> via the access transistor ATR of the selected memory cell. This causes a consumption current increase and a write error. For this reason, it is necessary that the time t3 is set to be prior to the time t4 and the time period C from t3 to t4 has some margin. Thus, in the case where the digit line driver 60C transmits, through the common word line CWL, the row selection signal during data write, it is necessary to allow the latch circuit 92 to adjust timing for supplying the data write current through the bit line BL.

Figure 23:
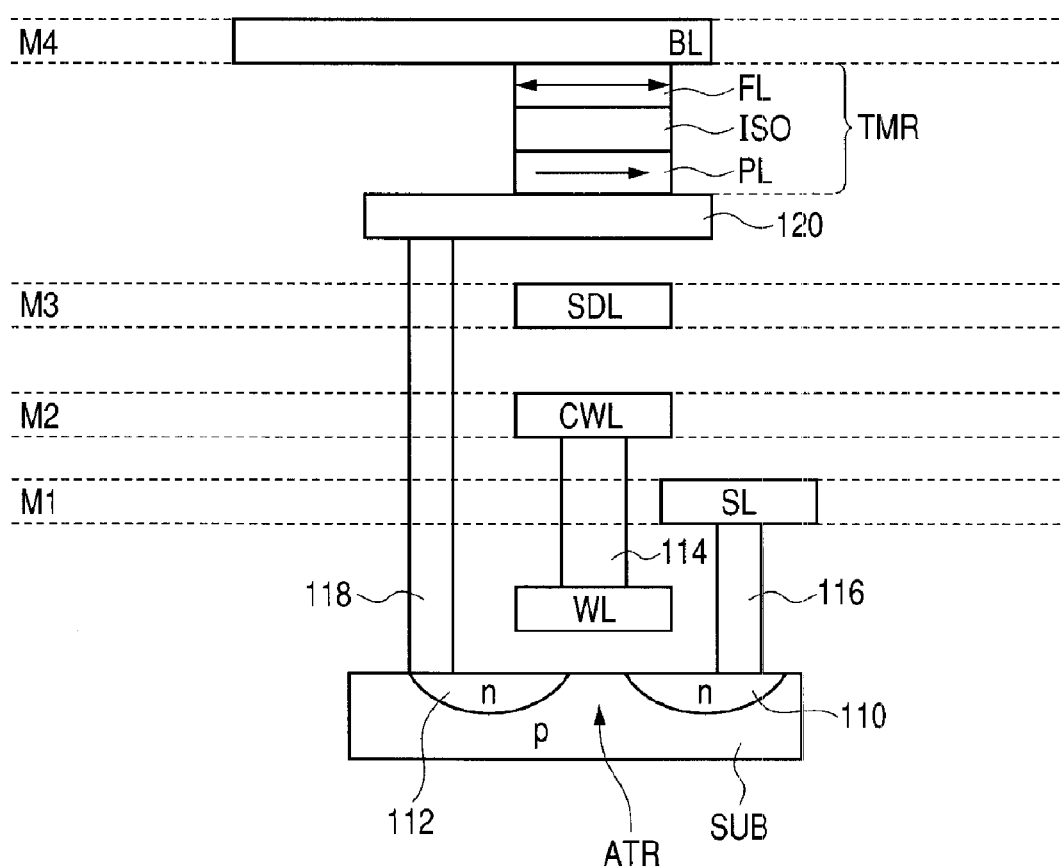
FIG. 23 is a sectional view of a memory cell MC according to the third embodiment.

FIG. 23 is a sectional view of a memory cell MC according to the third embodiment. In FIG. 23, an access transistor ATR is formed over the principal surface of a p-type semiconductor substrate SUB. The access transistor ATR has a source region 110 and a drain region 112 which are n-type regions and a gate. The gate is integrated with a word line WL. First to fourth metal wiring layers M1 to M4 are stacked through each interlayer insulating film, starting from the substrate side, over the principal surface of the semiconductor substrate SUB.

The source region 110 of the access transistor ATR is electrically coupled to a source line SL formed with the first metal wiring layer M1 through a metal film 116 formed in a contact hole. Further, the gate and the word line WL are electrically coupled to a common word line CWL formed with the second metal wiring layer M2 through a metal film 114 formed in a contact hole.

A sub-digit line SDL is formed with the third metal wiring layer M3. Further, a TMR element is disposed in an upper layer of the sub-digit line SDL. The TMR element has a pinned magnetic layer PL having a fixed magnetization direction and a free magnetic layer FL which is magnetized in a direction according to a data write magnetic field generated by a data write current. A tunnel barrier ISO formed of an insulation film is disposed between the pinned magnetic layer PL and the free magnetic layer FL.

The TMR element is electrically coupled to the drain region 112 of the access transistor ATR through a metal film 118 formed in a contact hole and a barrier metal 120. The barrier metal 120 is a buffer material for electrically coupling the TMR element to the metal film. A bit line BL is electrically coupled to the free magnetic layer FL of the TMR element and disposed in the fourth metal wiring layer M4 which is an upper layer of the TMR element.

The memory cell MC of FIG. 8 according to the first embodiment requires a metal wiring layer for forming the main digit line MDL. On the other hand, the memory cell MC of FIG. 23 according to the third embodiment does not require the main digit line MDL. Therefore, the memory cell MC of FIG. 23 according to the third embodiment is formed with four metal wiring layers by reducing one metal wiring layer of the main digit line MDL in the memory cell MC of FIG. 8 according to the first embodiment.

As described above, in the MRAM section of the semiconductor device 1 according to the third embodiment, the common word line CWL transmits the row selection signal during data write, thereby negating the need for the main digit line MDL in the MRAM section according to the first embodiment. Therefore, the MRAM section according to the third embodiment reduces one metal wiring layer in the MRAM section according to the first embodiment.

Further, the digit line driver 60C includes the latch circuit 92 for holding the active state of the common word line CWL. During writing to the selected memory cell, the latch circuit 92 supplies a current through the corresponding sub-digit line SDL in response to temporary activation of the word line WL corresponding to the selected memory cell before the start of current supply to the bit line BL corresponding to the selected memory cell. Further, even after the deactivation of the corresponding word line WL, the current supply to the sub-digit line SDL is maintained at least until the start of current supply to the corresponding bit line BL.

Therefore, at the time of writing data to the TMR element by supplying a data write current through the bit line BL, the word line WL can be deactivated. As a result, a data write current flowing through the bit line BL does not flow via the access transistor ATR, which can prevent a power consumption increase and a write error.

Further, the sub-digit line SDL for supplying a data write current during data write is provided individually for each memory block BK, as in the first embodiment. This can reduce the wiring resistance of the digit line, compared to the case where the digit line is provided common to a plurality of memory blocks BK. As a result, it is possible to supply a current large enough to write data.

Further, as in the first embodiment, with the use of the block selection signal BS on the basis of a column address signal CA, it is possible to supply the data write current through only the sub-digit line SDL provided in the memory block BK including the selected memory cell. As a result, it is possible to reduce the power consumption of the entire MRAM section and reduce the possibility of false writing to non-selected memory cells MC.

Further, as in the first embodiment, the common word line CWL electrically coupled at a plurality of points to the word line WL coupled to memory cells MC is disposed common to a plurality of memory blocks BK. Accordingly, it is possible to enhance the transmission speed of the activation signal to the memory cell MC and enhance the data reading speed, compared to the use of only the word line WL.

Further, by using the common word line CWL, the word line driver 50C can be provided common to a plurality of memory blocks BK. This can reduce an area for disposing the word line driver 50C, compared to the case where the word line driver 50C is provided for each memory block BK to directly activate the word line WL.

The structure from the semiconductor substrate SUB to the second metal wiring layer M2 in the sectional view of FIG. 23 is the same as that of the first embodiment in the sectional view of FIG. 8. Therefore, as in the case of the modification of the first embodiment, by performing (i) interconnection of the source regions of memory cells, (ii) change of the wiring of the source line, and (iii) change of the shape and arrangement of the connection portion between the word line and the common word line, it is possible to further enhance the integration density of the memory array.

The present embodiments are to be considered in all respects as illustrative and not restrictive, the scope of the invention being indicated by the appended claims rather than by the foregoing description and all changes which come within the meaning and range of equivalency of the claims are therefore indicated to be embraced therein.

What is claimed is:

1. A semiconductor device comprising:
   a memory array which is divided into a plurality of blocks in a row direction and includes a plurality of memory cells arranged in matrix form, each of the memory cells including a magneto-resistive element whose electrical resistance varies according to magnetic data and a switch element coupled in series with the magneto-resistive element and having a control electrode;
   a plurality of bit lines which are provided corresponding to memory cell columns of the memory array respectively and each used for supplying a first data write current in a direction corresponding to write data in a data write operation;
   a plurality of digit lines which are provided in each memory cell row in each of the blocks individually and used for supplying a second data write current in a direction intersecting the first data write current in said data write operation;
   a plurality of word lines which are each coupled to control electrodes of switch elements included in a corresponding memory cell row of the memory array and formed with a first wiring layer;
   a plurality of common word lines which are provided corresponding to memory cell rows of the memory array respectively and provided common to the blocks, each of the common word lines being formed with a second wiring layer in an upper layer with respect to the word lines formed with said first wiring layer and being electrically coupled at a plurality of points to a word line provided in a corresponding memory cell row;
a word line driver which is provided common to the blocks, operates with a first power supply voltage, and activates a common word line provided in the memory cell row selected in a data read operation; and
a plurality of digit line drive circuits, which are provided corresponding to the respective blocks and operate with a second power supply voltage higher than said first power supply voltage, to supply the second data write current through a digit line provided in the memory cell row selected in said data write operation.

2. The semiconductor device according to claim 1, further comprising:
a row selection circuit which is provided common to the blocks and selects a memory cell row including a memory cell subject to data read or subject to data write, based on an address signal.

3. The semiconductor device according to claim 1, wherein a sheet resistance of said first wiring layer for forming a word line is higher than a sheet resistance of said second wiring layer for forming a common word line.

* * * * *